(12) United States Patent
Srinivasan

(10) Patent No.: US 8,599,925 B2
(45) Date of Patent: Dec. 3, 2013

(54) EFFICIENT CODING AND DECODING OF TRANSFORM BLOCKS

(75) Inventor: Sridhar Srinivasan, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 1746 days.

(21) Appl. No.: 11/203,008

(22) Filed: Aug. 12, 2005

(65) Prior Publication Data

US 2007/0036223 A1 Feb. 15, 2007

(51) Int. Cl.
*H04N 7/12* (2006.01)

(52) U.S. Cl.
USPC ..................................... 375/240.18

(58) Field of Classification Search
USPC ............. 375/240.18; 382/248; 341/50, 63, 67
See application file for complete search history.

(56) References Cited

U.S. PATENT DOCUMENTS

| | | | |
|---|---|---|---|
| 4,420,771 A | 12/1983 | Pirsch | |
| 4,684,923 A * | 8/1987 | Koga | 341/63 |
| 4,698,672 A * | 10/1987 | Chen et al. | 375/240.12 |
| 4,792,981 A | 12/1988 | Cahill et al. | |
| 4,813,056 A | 3/1989 | Fedele | |
| 4,901,075 A * | 2/1990 | Vogel | 341/63 |
| 4,968,135 A | 11/1990 | Wallace et al. | |
| 5,040,217 A | 8/1991 | Brandenburg et al. | |
| 5,043,919 A | 8/1991 | Callaway et al. | |
| 5,045,938 A | 9/1991 | Sugiyama | |
| 5,089,818 A | 2/1992 | Mahieux et al. | |
| 5,128,758 A | 7/1992 | Azadegan | |
| 5,146,324 A | 9/1992 | Miller et al. | |
| 5,179,442 A | 1/1993 | Azadegan | |
| 5,227,788 A | 7/1993 | Johnston | |
| 5,227,878 A | 7/1993 | Puri et al. | |
| 5,266,941 A | 11/1993 | Akeley et al. | |
| 5,381,144 A | 1/1995 | Wilson et al. | |

(Continued)

FOREIGN PATENT DOCUMENTS

| | | |
|---|---|---|
| EP | 0 540 350 | 5/1993 |
| EP | 0 910 927 | 1/1998 |

(Continued)

OTHER PUBLICATIONS

U.S. Appl. No. 60/341,674, filed Dec. 2001, Lee et al.

(Continued)

*Primary Examiner* — Sath V Perungavoor
*Assistant Examiner* — James Pontius
(74) *Attorney, Agent, or Firm* — Klarquist Sparkman, LLP

(57) ABSTRACT

A block transform-based digital media codec more efficiently encodes transform coefficients by jointly-coding non-zero coefficients along with succeeding runs of zero-value coefficients. When a non-zero coefficient is the last in its block, a last indicator is substituted for the run value in the symbol for that coefficient. Initial non-zero coefficients are indicated in a special symbol which jointly-codes the non-zero coefficient along with initial and subsequent runs of zeroes. The codec allows for multiple coding contexts by recognizing breaks in runs of non-zero coefficients and coding non-zero coefficients on either side of such a break separately. The codec also reduces code table size by indicating in each symbol whether a non-zero coefficient has absolute value greater than 1 and whether runs of zeros have positive value, and separately encodes the level of the coefficients and the length of the runs outside of the symbols.

28 Claims, 21 Drawing Sheets

Transform Coefficients (1300)  C0, 0, 0, C1, 0, 0, 0, 0, C2, C3, 0, C4, 0, 0, 0, 0, 0, 0,...

3½D - 2½D Coding (1340)   3½D: <0, C0, 2>, <C1, 4>,   2½D: <C2, 0>, <C3, 1>, <C4, last>

1375   1355   1365

(56) References Cited

U.S. PATENT DOCUMENTS

| | | | |
|---|---|---|---|
| 5,394,170 A | 2/1995 | Akeley et al. |
| 5,400,075 A | 3/1995 | Savatier |
| 5,457,495 A | 10/1995 | Hartung |
| 5,461,421 A | 10/1995 | Moon |
| 5,467,134 A | 11/1995 | Laney |
| 5,481,553 A | 1/1996 | Suzuki |
| 5,493,407 A | 2/1996 | Takahara |
| 5,504,591 A | 4/1996 | Dujari |
| 5,533,140 A | 7/1996 | Sirat et al. |
| 5,544,286 A | 8/1996 | Laney |
| 5,559,557 A * | 9/1996 | Kato .................. 375/240.03 |
| 5,568,167 A | 10/1996 | Galbi et al. |
| 5,574,449 A | 11/1996 | Golin |
| 5,579,413 A * | 11/1996 | Bjontegaard ................ 382/248 |
| 5,579,430 A | 11/1996 | Grill et al. |
| 5,640,420 A | 6/1997 | Jung |
| 5,654,706 A | 8/1997 | Jeong et al. |
| 5,661,755 A | 8/1997 | Van de Kerkhof |
| 5,668,547 A | 9/1997 | Lee |
| 5,706,001 A | 1/1998 | Sohn |
| 5,717,821 A | 2/1998 | Tsutsui |
| 5,748,789 A | 5/1998 | Lee et al. |
| 5,819,215 A | 10/1998 | Dobson et al. |
| 5,825,830 A | 10/1998 | Kopf |
| 5,828,426 A | 10/1998 | Yu |
| 5,835,144 A | 11/1998 | Matsumura |
| 5,883,633 A | 3/1999 | Gill et al. |
| 5,884,269 A | 3/1999 | Cellier et al. |
| 5,946,043 A | 8/1999 | Lee et al. |
| 5,956,686 A | 9/1999 | Takashima et al. |
| 5,969,650 A | 10/1999 | Wilson et al. |
| 5,974,184 A | 10/1999 | Eifrig et al. |
| 5,982,437 A | 11/1999 | Okazaki |
| 5,990,960 A | 11/1999 | Murakami |
| 5,991,451 A | 11/1999 | Keith et al. |
| 5,995,670 A | 11/1999 | Zabinsky |
| 6,002,439 A | 12/1999 | Murakami |
| 6,049,630 A | 4/2000 | Wang et al. |
| 6,054,943 A | 4/2000 | Lawrence |
| 6,078,691 A | 6/2000 | Luttmer |
| 6,097,759 A | 8/2000 | Murakami |
| 6,100,825 A | 8/2000 | Sedluk |
| 6,111,914 A | 8/2000 | Bist |
| 6,148,109 A | 11/2000 | Boon |
| 6,154,572 A | 11/2000 | Chaddha |
| 6,205,256 B1 | 3/2001 | Chaddha |
| 6,215,910 B1 | 4/2001 | Chaddha |
| 6,223,162 B1 | 4/2001 | Chen |
| 6,226,407 B1 | 5/2001 | Zabih et al. |
| 6,233,017 B1 | 5/2001 | Chaddha |
| 6,253,165 B1 | 6/2001 | Malvar |
| 6,256,064 B1 | 7/2001 | Chujoh et al. |
| 6,259,810 B1 | 7/2001 | Gill et al. |
| 6,272,175 B1 | 8/2001 | Sriram et al. |
| 6,292,588 B1 | 9/2001 | Shen |
| 6,300,888 B1 | 10/2001 | Chen |
| 6,304,928 B1 | 10/2001 | Mairs et al. |
| 6,337,881 B1 | 1/2002 | Chaddha |
| 6,341,165 B1 | 1/2002 | Gbur |
| 6,345,123 B1 | 2/2002 | Boon |
| 6,349,152 B1 | 2/2002 | Chaddha |
| 6,360,019 B1 | 3/2002 | Chaddha |
| 6,377,930 B1 | 4/2002 | Chen |
| 6,392,705 B1 | 5/2002 | Chaddha |
| 6,404,931 B1 | 6/2002 | Chen |
| 6,420,980 B1 | 7/2002 | Ejima |
| 6,421,738 B1 | 7/2002 | Ratan et al. |
| 6,441,755 B1 | 8/2002 | Dietz et al. |
| 6,477,280 B1 | 11/2002 | Malvar |
| 6,493,385 B1 | 12/2002 | Sekiguchi et al. |
| 6,499,010 B1 | 12/2002 | Faller |
| 6,542,631 B1 | 4/2003 | Ishikawa |
| 6,542,863 B1 | 4/2003 | Surucu |
| 6,573,915 B1 | 6/2003 | Sivan et al. |
| 6,600,872 B1 | 7/2003 | Yamamoto |
| 6,611,798 B2 | 8/2003 | Bruhn et al. |
| 6,646,578 B1 * | 11/2003 | Au .................. 341/67 |
| 6,678,419 B1 | 1/2004 | Malvar |
| 6,680,972 B1 | 1/2004 | Liljeryd et al. |
| 6,690,307 B2 | 2/2004 | Karczewicz |
| 6,704,705 B1 | 3/2004 | Kabal et al. |
| 6,721,700 B1 | 4/2004 | Yin |
| 6,728,317 B1 | 4/2004 | Demos |
| 6,766,293 B1 | 7/2004 | Herre |
| 6,771,777 B1 | 8/2004 | Gbur |
| 6,795,584 B2 | 9/2004 | Karczewicz et al. |
| 6,825,847 B1 | 11/2004 | Molnar et al. |
| 6,879,268 B2 * | 4/2005 | Karczewicz .................. 341/67 |
| 6,947,886 B2 | 9/2005 | Rose et al. |
| 6,954,157 B2 | 10/2005 | Kadono et al. |
| 6,975,254 B1 | 12/2005 | Sperschneider et al. |
| 7,016,547 B1 | 3/2006 | Smirnov |
| 7,132,963 B2 * | 11/2006 | Pearlstein et al. .............. 341/67 |
| 2002/0076115 A1 | 6/2002 | Leeder et al. |
| 2003/0138150 A1 | 7/2003 | Srinivasan |
| 2003/0147561 A1 | 8/2003 | Faibish et al. |
| 2003/0156648 A1 | 8/2003 | Holcomb et al. |
| 2003/0202601 A1 | 10/2003 | Bjontegaard et al. |
| 2003/0225576 A1 | 12/2003 | Li et al. |
| 2004/0044534 A1 | 3/2004 | Chen et al. |
| 2004/0049379 A1 | 3/2004 | Thumpudi et al. |
| 2004/0136457 A1 | 7/2004 | Funnell et al. |
| 2005/0015249 A1 | 1/2005 | Mehrotra et al. |
| 2005/0041874 A1 | 2/2005 | Langelaar et al. |
| 2005/0052294 A1 | 3/2005 | Liang et al. |
| 2007/0030183 A1 * | 2/2007 | Kadono et al. .................. 341/67 |
| 2007/0172071 A1 | 7/2007 | Mehrotra et al. |
| 2007/0174062 A1 | 7/2007 | Mehrotra et al. |
| 2007/0200737 A1 * | 8/2007 | Gao et al. ........................ 341/50 |

FOREIGN PATENT DOCUMENTS

| | | |
|---|---|---|
| EP | 0 966 793 | 9/1998 |
| EP | 0 931 386 | 1/1999 |
| EP | 1 142 130 | 4/2003 |
| EP | 1 142 129 | 6/2004 |
| EP | 1 453 208 | 9/2004 |
| GB | 2 372 918 | 9/2002 |
| JP | 5-292481 | 11/1993 |
| JP | 6-021830 | 1/1994 |
| JP | 6-217110 | 8/1994 |
| JP | 7-504546 | 5/1995 |
| JP | 7-274171 | 10/1995 |
| JP | 8-079091 | 3/1996 |
| JP | 2000-506715 | 5/2000 |
| JP | 2002 204170 | 7/2002 |
| JP | 2002-246914 | 8/2002 |
| JP | 2004-364340 | 12/2004 |
| RU | 2090973 | 9/1997 |
| WO | WO 92/17884 | 10/1992 |
| WO | WO 92/17942 | 10/1992 |
| WO | WO 98/00924 | 1/1998 |
| WO | WO 03/045065 | 5/2003 |

OTHER PUBLICATIONS

U.S. Appl. No. 60/488,710, filed Jul. 2003, Srinivasan et al.

Bosi et al., "ISO/IEC MPEG-2 Advance Audio Coding," *J. Audio Eng. Soc.*, vol. 45, No. 10, pp. 789-812 (1997).

Brandenburg, "ASPEC Coding," *AES 10th International Conference*, pp. 81-90 (1991).

Chung et al., "A Novel Memory-efficient Huffman Decoding Algorithm and its Implementation," *Signal Processing* 62, pp. 207-213 (1997).

Cui et al., "A novel VLC based on second-run-level coding and dynamic truncation," *Proc. SPIE*, vol. 6077, pp. 607726-1 to 607726-9 (2006).

De Agostino et al., "Parallel Algorithms for Optimal Compression using Dictionaries with the Prefix Property," *Proc. Data Compression Conference '92, IEEE Computer Society Press*, pp. 52-62 (1992).

(56) References Cited

OTHER PUBLICATIONS

Gailly, "comp.compression Frequently Asked Questions (part 1/3)," 64 pp., document marked Sep. 5, 1999 [Downloaded from the World Wide Web on Sep. 5, 2007].
Gibson et al., *Digital Compression for Multimedia*, "Chapter 2: Lossless Source Coding," Morgan Kaufmann Publishers, Inc., San Francisco, pp. 17-61 (1998).
Gill et al., "Creating High-Quality Content with Microsoft Windows Media Encoder 7," 4 pp. (2000) [ Downloaded from the World Wide Web on May 1, 2002].
Hui et al., "Matsushita Algorithm for Coding of Moving Picture Information," ISO/IEC-JTC1/SC29/WG11, MPEG91/217, 76 pp. (Nov. 1991).
Ishii et al., "Parallel Variable Length Decoding with Inverse Quantization for Software MPEG-2 Decoders," IEEE Signal Processing Systems, pp. 500-509 (1997).
ISO/IEC, "ISO/IEC 11172-2, Information Technology—Coding of Moving Pictures and Associated Audio for Digital Storage Media at up to About 1.5 Mbit/s—Part 2: Video," 112 pp. (1993).
"ISO/IEC 11172-3, Information Technology—Coding of Moving Pictures and Associated Audio for Digital Storage Media at Up to Ab out 1.5 Mbit/s—Part 3: Audio," 154 pp. (1993).
"ISO/IEC 13818-7, Information Technology—Generic Coding of Moving Pictures and Associated Audio Information—Part 7: Advanced Audio Coding (AAC)," 174 pp. (1997).
ISO/IEC, "JTC1/SC29/WG11 N2202, Information Technology—Coding of Audio-Visual Objects: Visual, ISO/IEC 14496-2," 329 pp. (1998).
ITU-T, "ITU-T Recommendation H.261, Video Codec for Audiovisual Services at $p$ x 64 kbits," 25 pp. (1993).
ITU-T, "ITU-T Recommendation H.262, Information Technology—Generic Coding of Moving Pictures and Associated Audio Information: Video," 205 pp. (1995).
ITU-T, "ITU-T Recommendation H.263, Video coding for low bit rate communication," 162 pp. (1998).
Jeong et al., "Adaptive Huffman Coding of 2-D DCT Coefficients for Image Sequence Compression," *Signal Processing: Image Communication*, vol. 7, 11 pp. (1995).
Joint Video Team (JVT) of ISO/IEC MPEG & ITU-T VCEG, "Joint Final Committee Draft (JFCD) of Joint Video Specification," JVT-D157, 207 pp. (Aug. 2002).
Joint Video Team (JVT) of ISO/IEC MPEG & ITU-T VCEG, "Draft ITU-T Recommendation and Final Draft International Standard of Joint Video Specification (ITU-T Rec. H.264, ISO/IEC 14496-10 AVC)," 253 pp. (May 2003).
Lee, "Wavelet Filter Banks in Perceptual Audio Coding," Thesis presented to the University of Waterloo, 2003, 144 pages.
Li et al., "Optimal Linear Interpolation Coding for Server-Based Computing," *Proc. IEEE Int'l Conf. on Communications*, 5 pp. (Apr.-May 2002).
Microsoft Corporation, "Microsoft Debuts New Windows Media Player 9 Series, Redefining Digital Media on the PC," 4 pp. (Sep. 4, 2002) [Downloaded from the World Wide Web on Jul. 16, 2004].
Mook, "Next-Gen Windows Media Player Leaks to the Web," *BetaNews*, 18 pp. (Jul. 2002) [Downloaded from the World Wide Web on Mar. 16, 2004].
Nelson, *The Data Compression Book*, "Huffman One Better: Arithmetic Coding," Chapter 5, pp. 123-165 (1992).
Novak et al., "Spectral Band Replication and aacPlus Coding—An Overview," © 2003 TLC Corp., 2 pages.
Painter et al., "A Review of Algorithms for Perceptual Coding of Digital Audio Signals," 13th International Conference on Digital Signal Processing Proceedings, 1997, 30 pages.
Printouts of FTP directories from http://ftp3.itu.ch, 8 pp. [Downloaded from the World Wide Web on Sep. 20, 2005].
Reader, "History of MPEG Video Compression—Ver. 4.0," 99 pp., document marked Dec. 16, 2003.
Shamoon et al., "A Rapidly Adaptive Lossless Compression Algorithm for High Fidelity Audio Coding," *IEEE Data Compression Conf.*, pp. 430-439 (Mar. 1994).
Sullivan et al., "The H.264/AVC Advanced Video Coding Standard: Overview and Introduction to the Fidelity Range Extensions," 21 pp. (Aug. 2004).
Tu et al., "Context-Based Entropy Coding of Block Transform Coefficients for Image Compression," *IEEE Transactions on Image Processing*, vol. 11, No. 11, pp. 1271-1283 (Nov. 2002).
Wien et al., "16 Bit Adaptive Block Size Transforms," JVT-C107r1, 54 pp.
Wien, "Variable Block-Size Transforms for Hybrid Video Coding," Dissertation, 182 pp. (Feb. 2004).
Costa et al., "Efficient Run-Length Encoding of Binary Sources with Unknown Statistics", Technical Report No. MSR-TR-2003-95, pp. 1-10, Microsoft Research, Microsoft Corporation (Dec. 2003).
Malvar, "Fast Progressive Image Coding without Wavelets", IEEE Data Compression Conference, Snowbird, Utah, 10 pp. (Mar. 2000).
ITU-T Recommendation H.264, "Series H: Audiovisual and Multimedia Systems, Infrastructure of Audiovisual Services—Coding of Moving Video," International Telecommunication Union, pp. 1-262 (May 2003).
ITU-T Recommendation T.800, "Series T: Terminals for Telematic Services," International Telecommunication Union, pp. 1-194 (Aug. 2002).
ISO/IEC 14496-2, "Coding of Audio-Visual Object—Part 2: Visual," Third Edition, pp. 1-727, (Jun. 2004).
Search Report and Written Opinion of PCT/US06/30308 dated Oct. 23, 2007.
Examination Report dated Sep. 24, 2009, from corresponding New Zealand Patent Application No. 565672, 2 pp.
First Office Action dated Jan. 8, 2010, from corresponding Chinese Patent Application No. 200680029309.7, 9 pp.
Office action dated Jan. 19, 2010, from corresponding Australian Patent Application No. 2006280226, 2 pp.
Decision on Grant dated Sep. 27, 2010, from Russian Patent Application No. 2008105046, 17 pp. (including English translation).
Examiner's Report dated Oct. 22, 2010, from Australian Patent Application No. 2006280226, 4 pp.
Examination Report dated Jun. 10, 2011, from New Zealand Patent Application No. 565672, 2 pp.
Examination Report and Notice of Acceptance dated Jul. 8, 2011, from New Zealand Application No. 565672, 1 p.
Notice of Rejection dated Jun. 10, 2011, from Japanese Patent Application No. 2008-526079 (with English translation), 4 pp.
Notice of Allowance dated Dec. 27, 2011, from Japanese Patent Application No. 2008-526079, 6 pp.
Notice on the Second Office Action dated Oct. 17, 2011, from Chinese Patent Application No. 200680029309.7 (with English translation), 6 pp.
Examination Report dated Oct. 26, 2010, from New Zealand Patent Application No. 565672, 2 pp.
Notice of Acceptance dated Mar. 2, 2011, from Australian Patent Application No. 2006280226, 3 pp.
Notice of Rejection dated Nov. 19, 2010, from Japanese Patent Application No. 2008-526079 (with English translation), 7 pp.
Substantive Examination Adverse Report dated Dec. 31, 2010, from Malaysian Patent Application No. PI20063563, 4 pp.
Official Action dated Oct. 25, 2011, from Phillipines Patent Application No. 1-2008-500289, 1 pp.
Supplementary European Search Report dated Nov. 18, 2011, from European Patent Application No. 06789322.2, 3 pp.
Office action dated Jun. 22, 2011, from Israeli Patent Application No. 189126 (with English translation), 6 pp.
Notice on Grant of Patent Right for Invention dated Aug. 3, 2012, from Chinese Patent Application No. 200680029309.7, 4 pp.
Office action dated Mar. 5, 2013, from Israeli Patent Application No. 189126, 7 pp.

\* cited by examiner

Figure 10

```
Constants:
    MODELWEIGHT = 70
    Weight0[3] = { 240/*DC*/, 12/*LP*/, 1/*HP*/ }
    Weight1[3][16] = {  /* upto 16 channels permitted */
        { 0,240,120,80,  60,48,40,34,   30,27,24,22,  20,18,17,16 },
        { 0,12,6,4,      3,2,2,2,       2,1,1,1,      1,1,1,1 },
        { 0,16,8,5,      4,3,3,2,       2,2,2,1,      1,1,1,1 }
    }}
    Weight2[6] = { 120,37,2/*YUV 420*/,
                   120,18,1/*YUV 422*/ }

Model data structure:
    CAdaptiveModel {
        FLCState   /* internal state running from -8 to 7*/
                   /* FLCState is initialized to zero */
        FLCBits    /* k */
                   /* FLCBits is initialized to 0 for highpass,
*/
                   /* 4 for lowpass and 8 for DC */
    }

Function UpdateModelMB (
    Int Band,      /* band 0/1/2 => DC/LP/HP */
    COLORFORMAT cf,/* image color format */
    Int Channels,  /* number of chroma channels <= 16 */
    Int Count[],   /* number of coefficients in luma & chroma
bands */
    CAdaptiveModel Model)
{

/* Normalization */
    iLaplacianMean[0] *= Weight0[Band]
    if (cf == YUV_420) {
        iLaplacianMean[1] *= Weight2[Band]
    }
    else if (cf == YUV_422) {
        iLaplacianMean[1] *= aWeight2[3 + Band]
    }
    else {
        iLaplacianMean[1] *= Weight1[Band][iChannels - 1]
        if (Band == HP)
            iLaplacianMean[1] >>= 4
    }
    ...
```

/* Loop over luma & chroma */
    for (j = 0; j < 2; j++) {
        iLM = Count[j]
        iMS = Model.FLCState[j]

/* Calculate deviation from baseline */
        iDelta = (iLM - MODELWEIGHT) >> 2

/* Too few coefficients in the previous MB ? */
        if (iDelta < -8) {
            iDelta += 4   /* hysteresis */
            if (iDelta < -16)
                iDelta = -16
            iMS += iDelta
            if (iMS < -8) {
                if (Model.FLCBits [j] == 0)
                    iMS = -8
                else {
                    iMS = 0
                    Model.FLCBits[j]--  /* bump k down */
                }
            }
        }
/* Too many coefficients in the previous MB ? */
        else if (iDelta > 8) {
            iDelta -= 4   /* hysteresis */
            if (iDelta > 15)
                iDelta = 15
            iMS += iDelta
            if (iMS > 8) {
                iMS = 0
                Model.FLCBits [j]++   /* bump k up */
                if (Model.FLCBits [j] > 16)
                    Model.FLCBits [j] = 16
            }
        }

Model.FLCState[j] = iMS
    }
}
```

Transform
Coefficients
(1300)

C0, 0, 0, C1, 0, 0, 0, 0, C2, C3, 0, C4, 0, 0, 0, 0, 0, 0, 0,...

3½D - 2½D
Coding
(1340)

$\underbrace{<0, C0, 2>, <C1, 4>}_{1375}, \underbrace{<C2, 0>, <C3, 1>, <C4, last>}_{1365}$

3½D           2½D

1355

Software 2280 Implementing Transform
Coefficient Encoding

… # EFFICIENT CODING AND DECODING OF TRANSFORM BLOCKS

BACKGROUND

Block Transform-Based Coding

Transform coding is a compression technique used in many audio, image and video compression systems. Uncompressed digital image and video is typically represented or captured as samples of picture elements or colors at locations in an image or video frame arranged in a two-dimensional (2D) grid. This is referred to as a spatial-domain representation of the image or video. For example, a typical format for images consists of a stream of 24-bit color picture element samples arranged as a grid. Each sample is a number representing color components at a pixel location in the grid within a color space, such as RGB, or YIQ, among others. Various image and video systems may use various different color, spatial and time resolutions of sampling. Similarly, digital audio is typically represented as time-sampled audio signal stream. For example, a typical audio format consists of a stream of 16-bit amplitude samples of an audio signal taken at regular time intervals.

Uncompressed digital audio, image and video signals can consume considerable storage and transmission capacity. Transform coding reduces the size of digital audio, images and video by transforming the spatial-domain representation of the signal into a frequency-domain (or other like transform domain) representation, and then reducing resolution of certain generally less perceptible frequency components of the transform-domain representation. This generally produces much less perceptible degradation of the digital signal compared to reducing color or spatial resolution of images or video in the spatial domain, or of audio in the time domain.

More specifically, a typical block transform-based codec 100 shown in FIG. 1 divides the uncompressed digital image's pixels into fixed-size two dimensional blocks $(X_1, \ldots X_n)$, each block possibly overlapping with other blocks. A linear transform 120-121 that does spatial-frequency analysis is applied to each block, which converts the spaced samples within the block to a set of frequency (or transform) coefficients generally representing the strength of the digital signal in corresponding frequency bands over the block interval. For compression, the transform coefficients may be selectively quantized 130 (i.e., reduced in resolution, such as by dropping least significant bits of the coefficient values or otherwise mapping values in a higher resolution number set to a lower resolution), and also entropy or variable-length coded 130 into a compressed data stream. At decoding, the transform coefficients will inversely transform 170-171 to nearly reconstruct the original color/spatial sampled image/video signal (reconstructed blocks $\hat{X}_1, \ldots \hat{X}_n$).

The block transform 120-121 can be defined as a mathematical operation on a vector x of size N. Most often, the operation is a linear multiplication, producing the transform domain output y=M x, M being the transform matrix. When the input data is arbitrarily long, it is segmented into N sized vectors and a block transform is applied to each segment. For the purpose of data compression, reversible block transforms are chosen. In other words, the matrix M is invertible. In multiple dimensions (e.g., for image and video), block transforms are typically implemented as separable operations. The matrix multiplication is applied separably along each dimension of the data (i.e., both rows and columns).

For compression, the transform coefficients (components of vector y) may be selectively quantized (i.e., reduced in resolution, such as by dropping least significant bits of the coefficient values or otherwise mapping values in a higher resolution number set to a lower resolution), and also entropy or variable-length coded into a compressed data stream.

At decoding in the decoder 150, the inverse of these operations (dequantization/entropy decoding 160 and inverse block transform 170-171) are applied on the decoder 150 side, as show in FIG. 1. While reconstructing the data, the inverse matrix $M^{-1}$ (inverse transform 170-171) is applied as a multiplier to the transform domain data. When applied to the transform domain data, the inverse transform nearly reconstructs the original time-domain or spatial-domain digital media.

In many block transform-based coding applications, the transform is desirably reversible to support both lossy and lossless compression depending on the quantization factor. With no quantization (generally represented as a quantization factor of 1) for example, a codec utilizing a reversible transform can exactly reproduce the input data at decoding. However, the requirement of reversibility in these applications constrains the choice of transforms upon which the codec can be designed.

Many image and video compression systems, such as MPEG and Windows Media, among others, utilize transforms based on the Discrete Cosine Transform (DCT). The DCT is known to have favorable energy compaction properties that result in near-optimal data compression. In these compression systems, the inverse DCT (IDCT) is employed in the reconstruction loops in both the encoder and the decoder of the compression system for reconstructing individual image blocks.

Entropy Coding of Wide-Range Transform Coefficients
Wide dynamic range input data leads to even wider dynamic range transform coefficients generated during the process of encoding an image. For instance, the transform coefficients generated by an N by N DCT operation have a dynamic range greater than N times the dynamic range of the original data. With small or unity quantization factors (used to realize low-loss or lossless compression), the range of quantized transform coefficients is also large. Statistically, these coefficients have a Laplacian distribution as shown in FIGS. 2 and 3. FIG. 2 shows a Laplacian distribution for wide dynamic range coefficients. FIG. 3 shows a Laplacian distribution for typical narrow dynamic range coefficients.

Conventional transform coding is tuned for a small dynamic range of input data (typically 8 bits), and relatively large quantizers (such as numeric values of 4 and above). FIG. 3 is therefore representative of the distribution of transform coefficients in such conventional transform coding. Further, the entropy encoding employed with such conventional transform coding can be a variant of run-level encoding, where a succession of zeroes is encoded together with a non-zero symbol. This can be an effective means to represent runs of zeroes (which occur with high probability), as well as capturing inter-symbol correlations.

On the other hand, conventional transform coding is less suited to compressing wide dynamic range distributions such as that shown in FIG. 2. Although the symbols are zero with higher probability than any other value (i.e., the distribution peaks at zero), the probability of a coefficient being exactly zero is miniscule for the wide dynamic range distribution. Consequently, zeroes do not occur frequently, and run length entropy coding techniques that are based on the number of zeroes between successive non-zero coefficients are highly inefficient for wide dynamic range input data.

The wide dynamic range distribution also has an increased alphabet of symbols, as compared to the narrow range distribution. Due to this increased symbol alphabet, the entropy table(s) used to encode the symbols will need to be large. Otherwise, many of the symbols will end up being escape coded, which is inefficient. The larger tables require more memory and may also result in higher complexity.

The conventional transform coding therefore lacks versatility—working well for input data with the narrow dynamic range distribution, but not on the wide dynamic range distribution.

However, on narrow-range data, finding efficient entropy coding of quantized transform coefficients is a critical processes. Any performance gains that can be achieved in this step (gains both in terms of compression efficiency and encoding/decoding speed) translate to overall quality gains.

Different entropy encoding schemes are marked by their ability to successfully take advantage of such disparate efficiency criteria as: use of contextual information, higher compression (such as arithmetic coding), lower computational requirements (such as found in Huffman coding techniques), and using a concise set of code tables to minimize encoder/decoder memory overhead. Conventional entropy encoding methods, which do not meet all of these features, do not demonstrate thorough efficiency of encoding transformation coefficients.

SUMMARY

A digital media coding and decoding technique and realization of the technique in a digital media codec described herein achieves more effective compression of transform coefficients. For example, one exemplary block transform-based digital media codec illustrated herein more efficiently encodes transform coefficients by jointly-coding non-zero coefficients along with succeeding runs of zero-value coefficients. When a non-zero coefficient is the last in its block, a last indicator is substituted for the run value in the symbol for that coefficient. Initial non-zero coefficients are indicated in a special symbol which jointly-codes the non-zero coefficient along with initial and subsequent runs of zeroes.

The exemplary codec allows for multiple coding contexts by recognizing breaks in runs of non-zero coefficients and coding non-zero coefficients on either side of such a break separately. Additional contexts are provided by context switching based on inner, intermediate, and outer transforms as well as by context switching based on whether transforms correspond to luminance or chrominance channels. This allows code tables to have smaller entropy, without creating so many contexts as to dilute their usefulness.

The exemplary codec also reduces code table size by indicating in each symbol whether a non-zero coefficient has absolute value greater than 1 and whether runs of zeros have positive value, and separately encodes the level of the coefficients and the length of the runs outside of the symbols. The codec can take advantage of context switching for these separately-coded runs and levels.

The various techniques and systems can be used in combination or independently.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be made apparent from the following detailed description of embodiments that proceeds with reference to the accompanying drawings.

BRIEF DESCRIPTION OF THE DRAWINGS

FIGS. 10 and 11 are a pseudo-code listing of the adaptation process of FIG. 9.

FIG. 13 illustrates one example of transform coefficients encoded according to encoding techniques described herein.

DETAILED DESCRIPTION

The following description relates to coding and decoding techniques that adaptively adjust for more efficient entropy coding of wide-range transform coefficients, as well as for more efficient entropy coding of transform coefficients in general. The following description describes an example implementation of the technique in the context of a digital media compression system or codec. The digital media system codes digital media data in a compressed form for transmission or storage, and decodes the data for playback or other processing. For purposes of illustration, this exemplary compression system incorporating this adaptive coding of wide range coefficients is an image or video compression system. Alternatively, the technique also can be incorporated into compression systems or codecs for other 2D data. The adaptive coding of wide range coefficients technique does not require that the digital media compression system encodes the compressed digital media data in a particular coding format.

1. Encoder/Decoder

Figure 4:
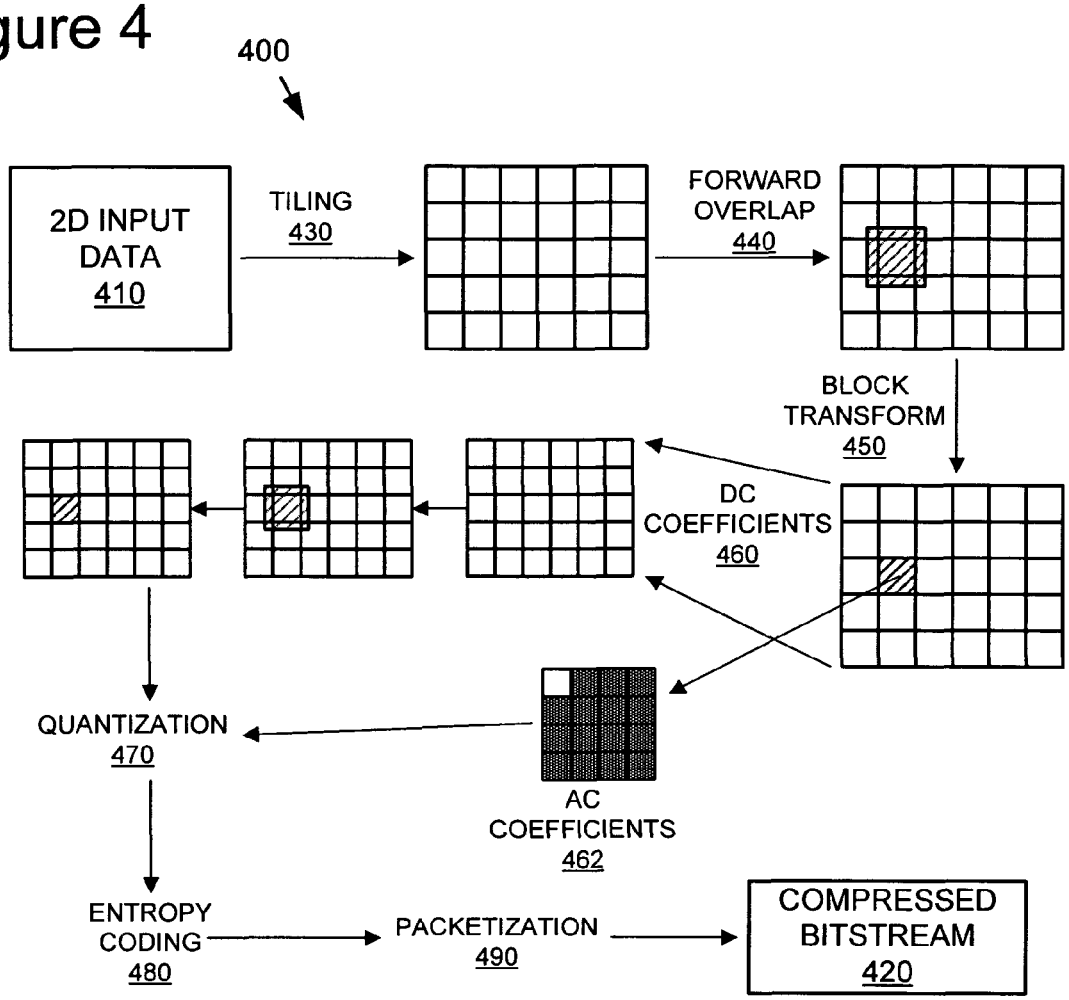
FIG. 4 is a flow diagram of a representative encoder incorporating the adaptive coding of wide range coefficients.
Figure 5:
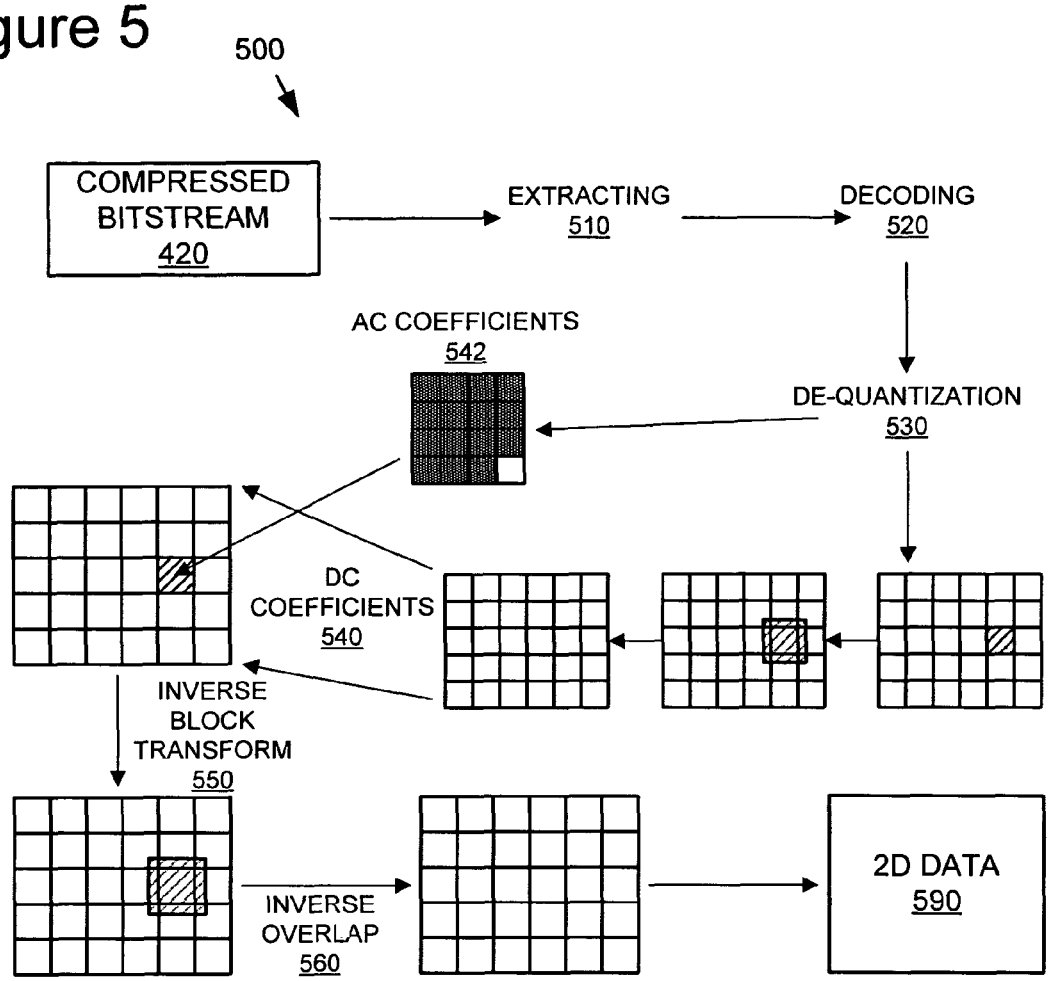
FIG. 5 is a flow diagram of a representative decoder incorporating the decoding of adaptively coded wide range coefficients.

FIGS. 4 and 5 are a generalized diagram of the processes employed in a representative 2-dimensional (2D) data encoder 400 and decoder 500. The diagrams present a generalized or simplified illustration of a compression system incorporating the 2D data encoder and decoder that implement the adaptive coding of wide range coefficients. In alternative compression systems using the adaptive coding of wide range coefficients, additional or fewer processes than those illustrated in this representative encoder and decoder can be used for the 2D data compression. For example, some encoders/decoders may also include color conversion, color formats, scalable coding, lossless coding, macroblock modes, etc. The compression system (encoder and decoder) can provide lossless and/or lossy compression of the 2D data, depending on the quantization which may be based on a quantization parameter varying from lossless to lossy.

The 2D data encoder 400 produces a compressed bitstream 420 that is a more compact representation (for typical input) of 2D data 410 presented as input to the encoder. For example, the 2D data input can be an image, a frame of a video sequence, or other data having two dimensions. The 2D data encoder tiles 430 the input data into macroblocks, which are 16×16 pixels in size in this representative encoder. The 2D data encoder further tiles each macroblock into 4×4 blocks. A "forward overlap" operator 440 is applied to each edge between blocks, after which each 4×4 block is transformed using a block transform 450. This block transform 450 can be the reversible, scale-free 2D transform described by Srinivasan, U.S. patent application Ser. No. 11/015,707, entitled, "Reversible Transform For Lossy And Lossless 2-D Data Compression," filed Dec. 17, 2004. The overlap operator 440 can be the reversible overlap operator described by Tu et al., U.S. patent application Ser. No. 11/015,148, entitled, "Reversible Overlap Operator for Efficient Lossless Data Compression," filed Dec. 17, 2004; and by Tu et al., U.S. patent application Ser. No. 11/035,991, entitled, "Reversible 2-Dimensional Pre-/Post-Filtering For Lapped Biorthogonal Transform," filed Jan. 14, 2005. Alternatively, the discrete cosine transform or other block transforms and overlap operators can be used. Subsequent to the transform, the DC coefficient 460 of each 4×4 transform block is subject to a similar processing chain (tiling, forward overlap, followed by 4×4 block transform). The resulting DC transform coefficients and the AC transform coefficients are quantized 470, entropy coded 480 and packetized 490.

The decoder performs the reverse process. On the decoder side, the transform coefficient bits are extracted 510 from their respective packets, from which the coefficients are themselves decoded 520 and dequantized 530. The DC coefficients 540 are regenerated by applying an inverse transform, and the plane of DC coefficients is "inverse overlapped" using a suitable smoothing operator applied across the DC block edges. Subsequently, the entire data is regenerated by applying the 4×4 inverse transform 550 to the DC coefficients, and the AC coefficients 542 decoded from the bitstream. Finally, the block edges in the resulting image planes are inverse overlap filtered 560. This produces a reconstructed 2D data output.

In an exemplary implementation, the encoder 400 (FIG. 4) compresses an input image into the compressed bitstream 420 (e.g., a file), and the decoder 500 (FIG. 5) reconstructs the original input or an approximation thereof, based on whether lossless or lossy coding is employed. The process of encoding involves the application of a forward lapped transform (LT) discussed below, which is implemented with reversible 2-dimensional pre-/post-filtering also described more fully below. The decoding process involves the application of the inverse lapped transform (ILT) using the reversible 2-dimensional pre-/post-filtering.

The illustrated LT and the ILT are inverses of each other, in an exact sense, and therefore can be collectively referred to as a reversible lapped transform. As a reversible transform, the LT/ILT pair can be used for lossless image compression.

The input data 410 compressed by the illustrated encoder 400/decoder 500 can be images of various color formats (e.g., RGB/YUV4:4:4, YUV4:2:2 or YUV4:2:0 color image formats). Typically, the input image always has a luminance (Y) component. If it is a RGB/YUV4:4:4, YUV4:2:2 or Yuv4:2:0 image, the image also has chrominance components, such as a U component and a V component. The separate color planes or components of the image can have different spatial resolutions. In case of an input image in the YUV 4:2:0 color format for example, the U and V components have half of the width and height of the Y component.

As discussed above, the encoder 400 tiles the input image or picture into macroblocks. In an exemplary implementation, the encoder 400 tiles the input image into 16×16 macroblocks in the Y channel (which may be 16×16, 16×8 or 8×8 areas in the U and V channels depending on the color format). Each macroblock color plane is tiled into 4×4 regions or blocks. Therefore, a macroblock is composed for the various color formats in the following manner for this exemplary encoder implementation:

1. For a grayscale image, each macroblock contains 16 4×4 luminance (Y) blocks.
2. For a YUV4:2:0 format color image, each macroblock contains 16 4×4 Y blocks, and 4 each 4×4 chrominance (U and V) blocks.
3. For a YUV4:2:2 format color image, each macroblock contains 16 4×4 Y blocks, and 8 each 4×4 chrominance (U and V) blocks.
4. For a RGB or YUV4:4:4 color image, each macroblock contains 16 blocks each of Y, U and V channels.

2. Adaptive Coding of Wide-Range Coefficients

In the case of wide dynamic range data, especially decorrelated transform data (such as, the coefficients 460, 462 in the encoder of FIG. 4), a significant number of lower order bits are unpredictable and "noisy." In other words, there is not much correlation in the lower order bits that can be used for efficient entropy coding. The bits have a high entropy, approaching 1 bit for every bit encoded.

2.1 Grouping

Figure 1:
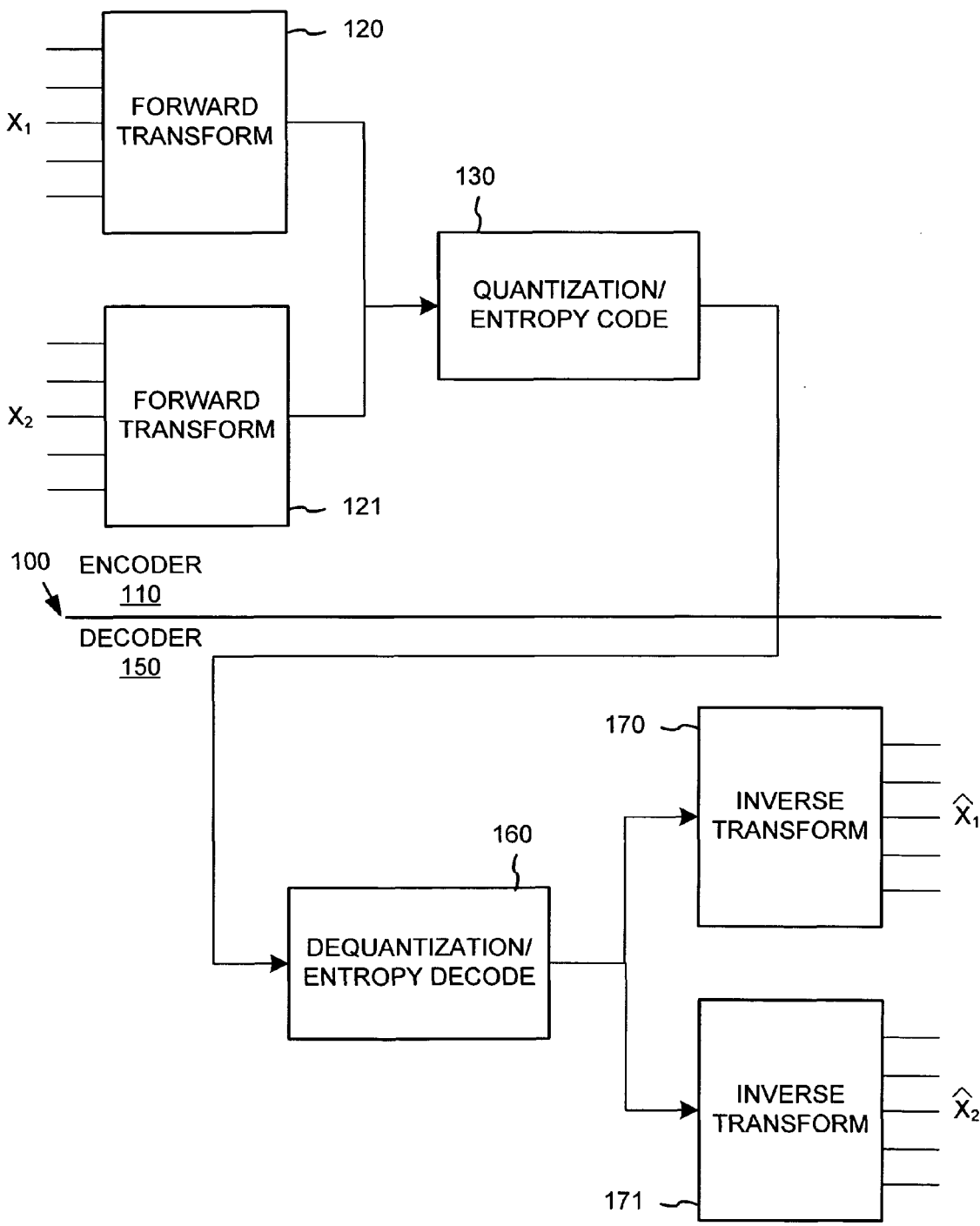
FIG. 1 is a block diagram of a conventional block transform-based codec in the prior art.
Figure 2:
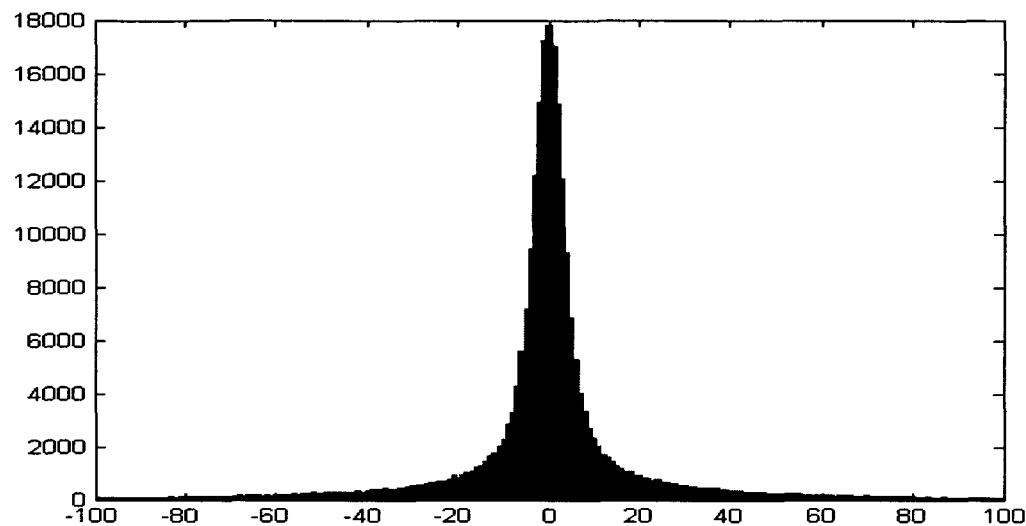
FIG. 2 is a histogram showing a distribution of transform coefficients having a wide dynamic range.
Figure 3:
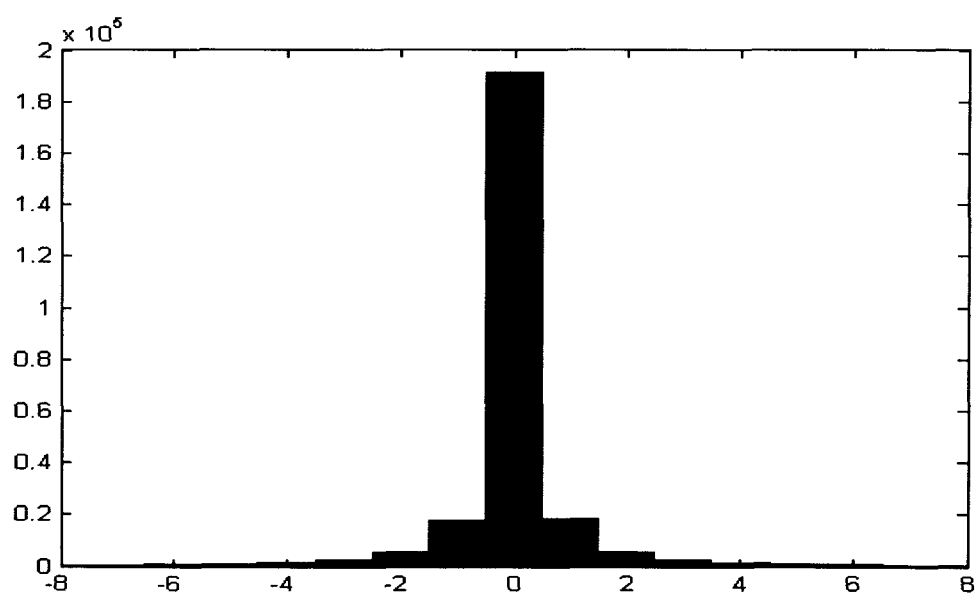
FIG. 3 is a histogram showing a distribution of narrow range coefficients.

Further, the Laplacian probability distribution function of wide range transform coefficients shown in FIG. 3 is given by $$\frac{\lambda}{2} e^{-\lambda |x|}$$

(for convenience, the random variable corresponding to the transform coefficients is treated as a continuous value). For wide dynamic range data, $\lambda$ is small, and the absolute mean $1/\lambda$ is large. The slope of this distribution is bounded within $\pm \frac{1}{2} (\lambda^2)$, which is very small. This means that the probability of a transform coefficient being equal to x is very close to the probability of x+ζ for a small shift ζ. In the discrete domain, this translates to the claim, "the probability of a transform coefficient taking on adjacent values j and (j+1) is almost identical."

Figure 6:
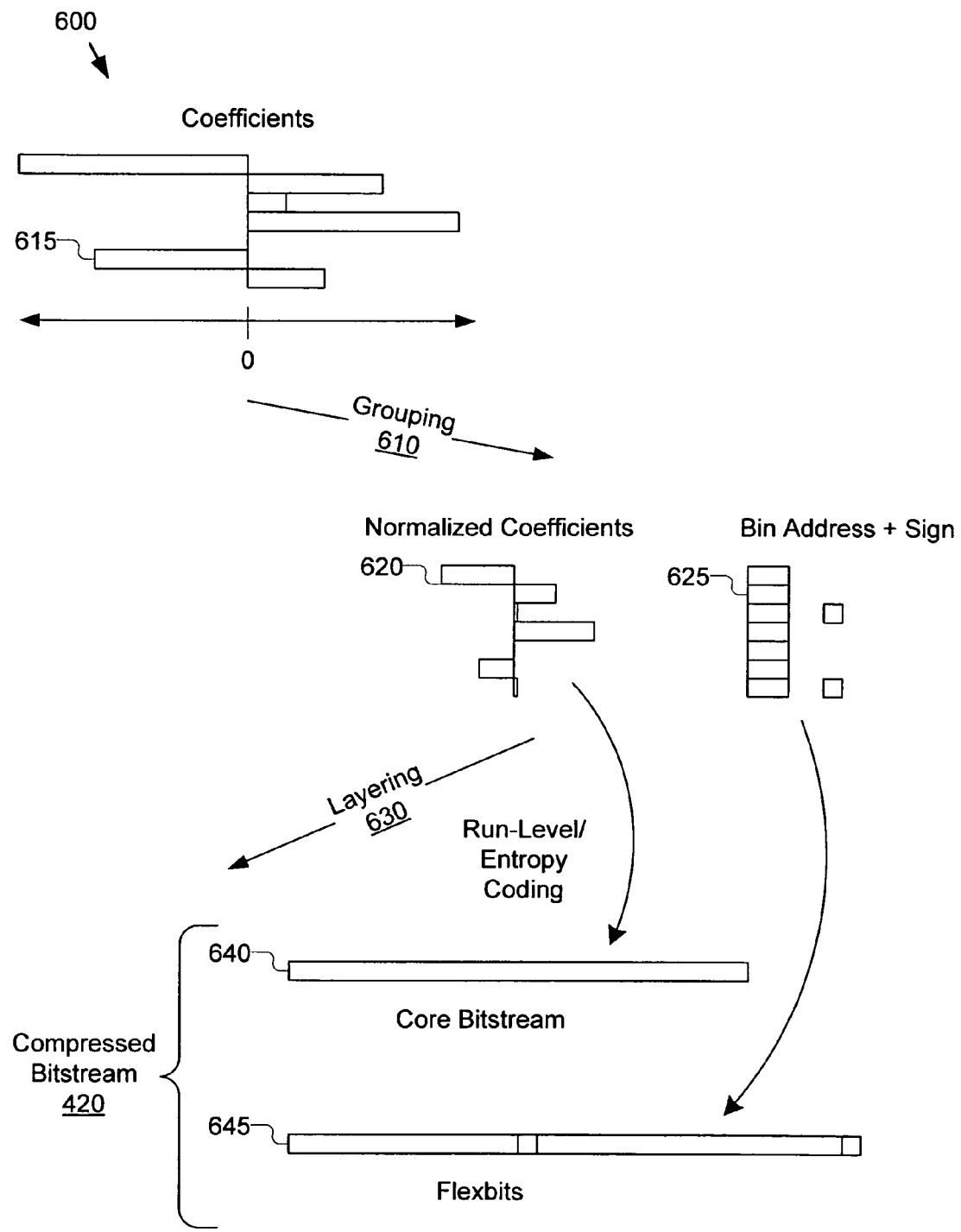
FIG. 6 is a flow diagram illustrating grouping and layering of transform coefficient in the adaptive coding of wide range coefficients, such as in the encoder of FIG. 4.

With reference now to FIG. 6, the adaptive coding of wide-range coefficients performs a grouping 610 of successive symbols of the alphabet into "bins" of N symbols. The number of symbols per bin can be any number N. For practicality, however, the number N is desirably a power of 2 (i.e., $N=2^k$), so that the index or address of a coefficient within a bin can be encoded efficiently as a fixed length code. For example, the symbols can be grouped into pairs, such that a symbol can be identified as the index of the pair, together with the index of the symbol within the pair.

This grouping has the benefit that with a suitable choice of N, the probability distribution of the bin index for wide range coefficients more closely resembles the probability distribution of narrow range data, e.g., that shown in FIG. 3. The grouping is mathematically similar to a quantization operation. This means that the bin index can be efficiently encoded using variable length entropy coding techniques that work best with data having the narrow range probability distribution.

Based on the grouping of coefficients into bins, the encoder can then encode a transform coefficient 615 using an index of its bin (also referred to herein as the normalized coefficient 620) and its address within the bin (referred to herein as the bin address 625). The normalized coefficient is encoded using variable length entropy coding, while the bin address is encoded by means of a fixed length code.

The choice of N (or equivalently, the number of bits k for the fixed length coding of the bin address) determines the granularity of grouping. In general, the wider the range of the transform coefficients, the larger value of k should be chosen. When k is carefully chosen, the normalized coefficient Y is zero with high probability that matches the entropy coding scheme for Y.

As described below, the value k can be varied adaptively (in a backward-adaptive manner) in the encoder and decoder. More specifically, the value of k on both the encoder and decoder varies based on the previously encoded/decoded data only.

In one particular example of this encoding shown in FIG. 7, the encoder encodes a transform coefficient X as follows. For an initial action 710, the encoder calculates a normalized coefficient Y for the transform coefficient. In this example implementation, the normalized coefficient Y is defined as Y=sign(X)*floor(abs(X)/N), for a certain choice of bin size $N=2^k$. The encoder encodes the symbol Y using an entropy code (action 720), either individually or jointly with other symbols. Next, at action 730, the encoder determines a bin address (Z) of the transform coefficient X. In this example implementation, the bin address is the remainder of the integer division of abs(X) by the bin size N, or Z=abs(X)%N. The encoder encodes this value as a fixed length code of k bits at action 740. Further, in the case of a non-zero transform coefficient, the encoder also encodes the sign. More specifically, as indicated in actions 750-760, the encoder encodes the sign of the normalized coefficient (Y) when the normalized coefficient is non-zero. Further, in the case that the normalized coefficient is zero and the transform coefficient is non-zero, the encoder encodes the sign of the transform coefficient (X). Since the normalized coefficient is encoded using a variable length entropy code, it is also referred to herein as the variable length part, and the bin address (Z) is also referred to as the fixed length part. In other alternative implementations, the mathematical definitions of the normalized coefficient, bin address and sign for a transform coefficient can vary.

Figure 7:
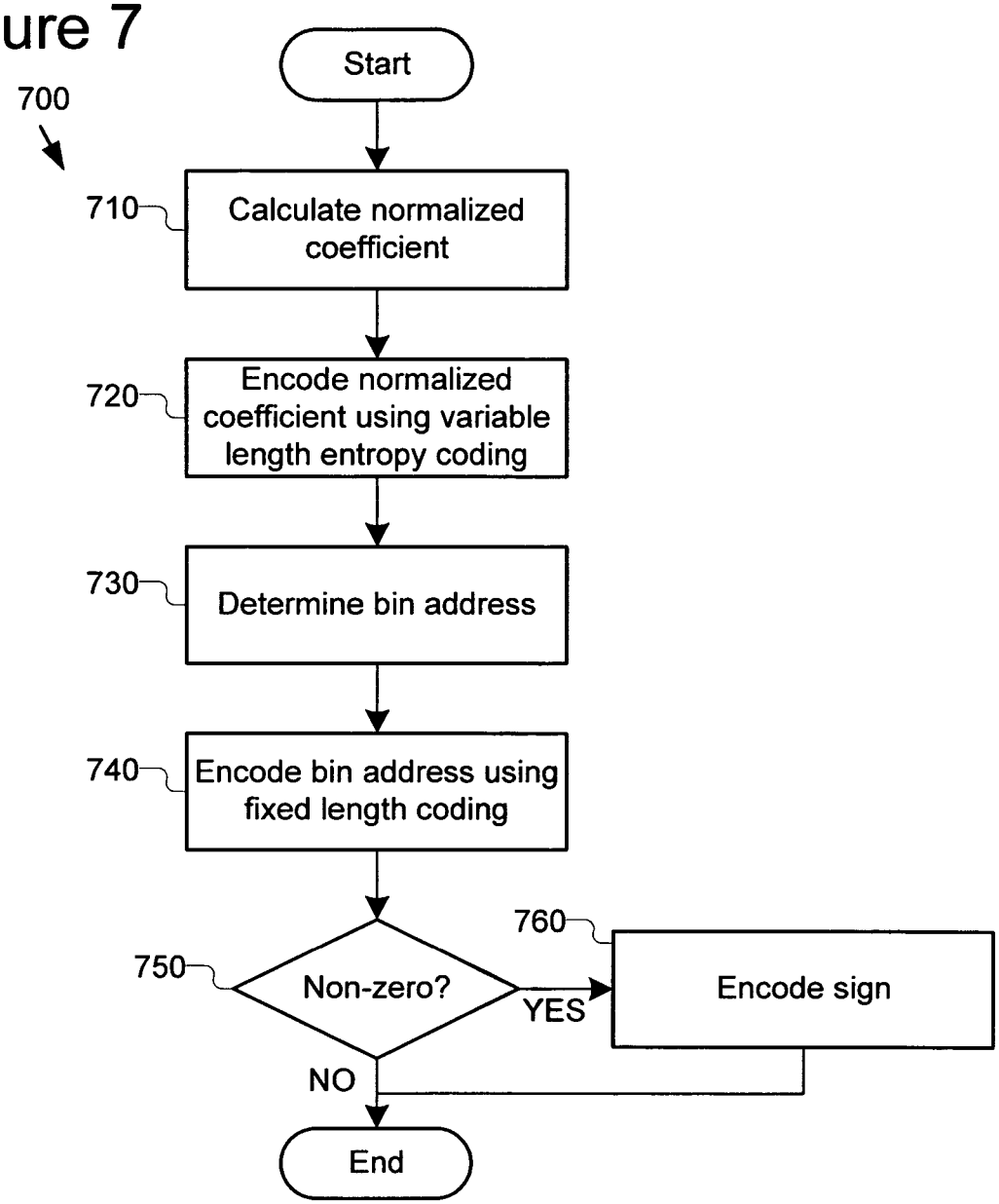
FIG. 7 is a flow chart showing a process by the encoder of FIG. 4 to encode a transform coefficient for a chosen grouping of transform coefficients in bins.
Figure 8:
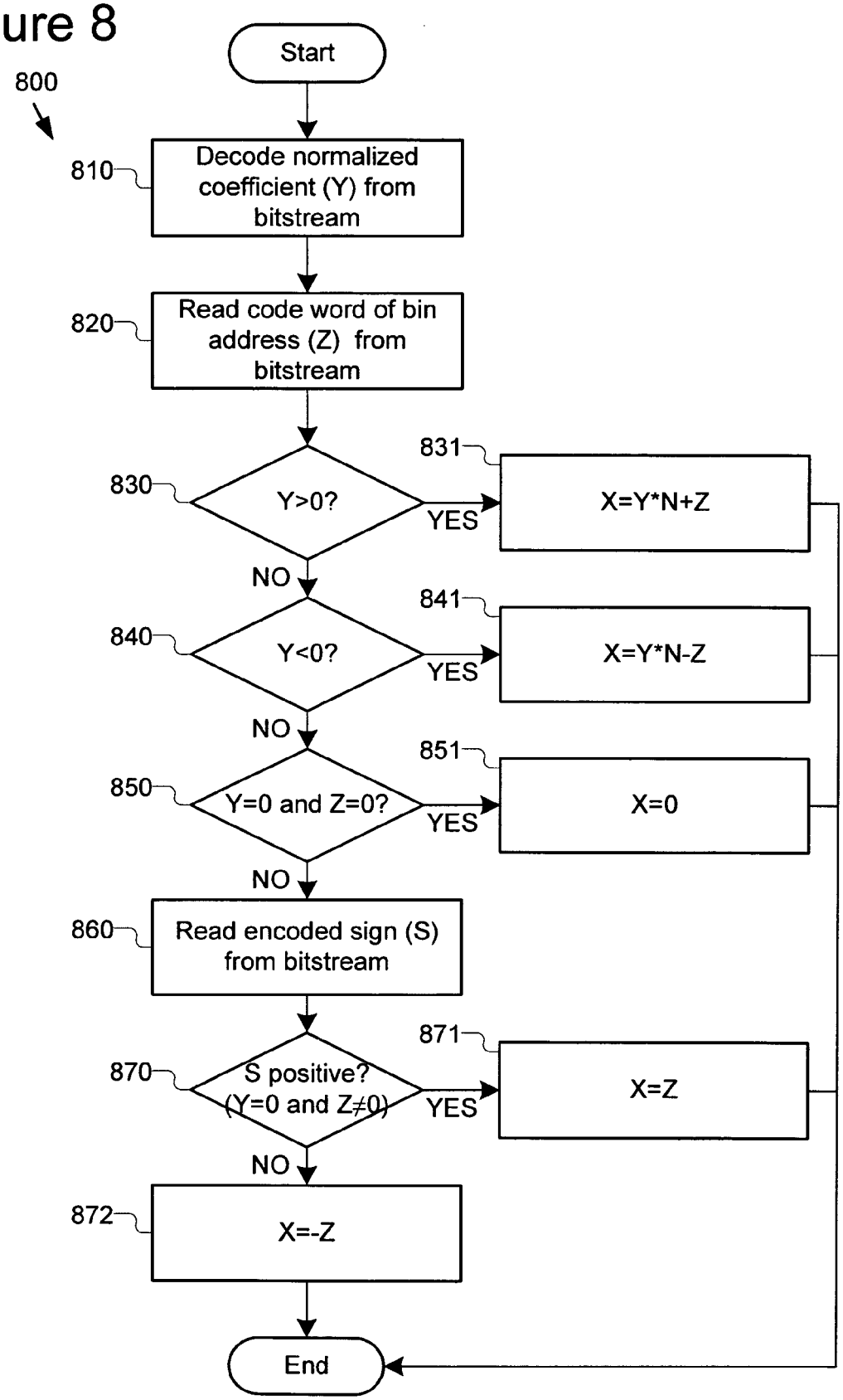
FIG. 8 is a flow chart showing a process by the decoder of FIG. 5 to reconstruct the transform coefficient encoded via the process of FIG. 7.

Continuing this example, FIG. 8 shows an example process 800 by the decoder 500 (FIG. 5) to reconstruct the transform coefficient that was encoded by the process 700 (FIG. 7). At action 810, the decoder decodes the normalized coefficient (Y) from the compressed bitstream 420 (FIG. 5), either individually or in conjunction with other symbols as defined in the block coding process. The decoder further reads the k-bit code word for the bin address and the sign (when encoded) from the compressed bitstream at action 820. At actions 830 to 872, the decoder then reconstructs the transform coefficient, as follows:

1. When Y>0 (action 830), then the transform coefficient is reconstructed as X=Y*N+Z (action (831)).
2. When Y<0 (action 840), then the transform coefficient is reconstructed as X=Y*N−Z (action 841).
3. When Y=0 and Z=0 (action 850), then the transform coefficient is reconstructed as X=0 (action 851).
4. When Y=0 and Z≠0, the decoder further reads the encoded sign (S) from the compressed bitstream (action 860). If the sign is positive (S=0) (action 870), then the transform coefficient is reconstructed as X=Z (action 871). Else, if the sign is negative (S=1), the transform coefficient is reconstructed as X=−Z (action 872).

2.2 Layering

With reference again to FIG. 6, the encoder and decoder desirably abstracts out the fixed length coded bin addresses 625 and sign into a separate coded layer (herein called the "Flexbits" layer 645) in the compressed bitstream 420 (FIG. 4). The normalized coefficients 620 are encoded in a layer of the core bitstream 640. This allows the encoder and/or decoder the option to downgrade or entirely drop this Flexbits portion of the encoding, as desired, to meet bit rate or other constraints. Even with the encoder entirely dropping the Flexbits layer, the compressed bitstream would still decode, albeit at a degraded quality. The decoder could still reconstruct the signal from the normalized coefficients portion alone. This is effectively similar to applying a greater degree of quantization 470 (FIG. 4) in the encoder. The encoding of the bin addresses and sign as a separate flexbits layer also has the potential benefit that in some encoder/decoder implementations, a further variable length entropy coding (e.g., arithmetic coding, Lempel-Ziv, Burrows-Wheeler, etc.) could be applied to the data in this layer for further improved compression.

For layering, sections of the compressed bitstream containing the flexbits portion are signaled by a separate layer header or other indication in the bitstream so that the decoder can identify and separate (i.e., parse) the Flexbits layer 645 (when not omitted) from the core bitstream 640.

Layering presents a further challenge in the design of backward adaptive grouping (described in the following section). Since the Flexbits layer may be present or absent in a given bitstream, the backward-adaptive grouping model cannot reliably refer to any information in the Flexbits layer. All information needed to determine the number of fixed length code bits k (corresponding to the bin size $N=2^k$) should reside in the causal, core bitstream.

2.3 Adaptation

The encoder and decoder further provide a backward-adapting process to adaptively adjust the choice of the number k of fixed length code bits, and correspondingly the bin size N of the grouping described above, during encoding and decoding. In one implementation, the adaptation process can be based on modeling the transform coefficients as a Laplacian distribution, such that the value of k is derived from the Laplacian parameter λ. However, such a sophisticated model would require that the decoder perform the inverse of the grouping 610 (reconstructing the transform coefficients from both the normalized coefficients in the core bitstream 640 and the bin address/sign in the Flexbits layer 645) in FIG. 6 prior to modeling the distribution for future blocks. This requirement would violate the layering constraint that the decoder should permit dropping the Flexbits layer from the compressed bitstream 420.

Figure 9:
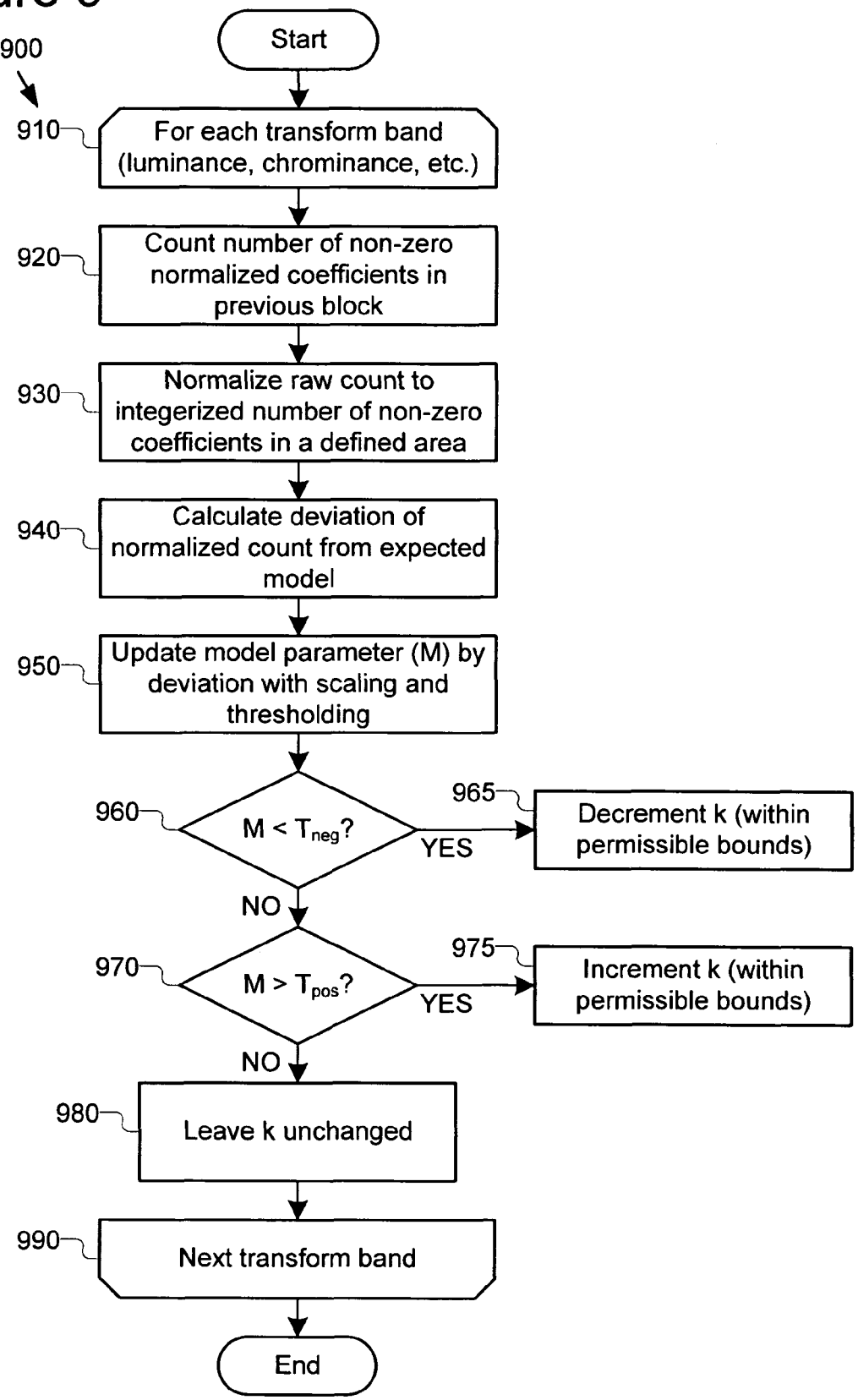
FIG. 9 is a flow chart showing an adaptation process for adaptively varying the grouping in FIG. 6 to produce a more optimal distribution for entropy coding of the coefficients.

In the example implementation shown in FIG. 9, the adaptation process 900 is instead based on the observation that a more optimal run-length encoding of the transform coefficients is achieved when around one quarter of the coefficients are non-zero. Thus, an adaptation parameter that can be used to tune the grouping towards a "sweet-spot" situation where around three-fourths of the normalized coefficients are zero will provide good entropy coding performance. Accordingly, the number of non-zero normalized coefficients in a block is used as the adaptation parameter in the example implementation. This adaptation parameter has the advantage that it depends only upon the information contained in the core bitstream, which meets the layering constraint that the transform coefficients can still be decoded with the Flexbits layer omitted. The process is a backward adaptation in the sense that the adaptation model applied when encoding/decoding the current block is based on information from the previous block(s).

In its adaptation process, the example encoder and decoder performs the adaptation on a backward adaptation basis. That is to say, a current iteration of the adaptation is based on information previously seen in the encoding or decoding process, such as in the previous block or macroblock. In the example encoder and decoder, the adaptation update occurs once per macroblock for a given transform band, which is intended to minimize latency and cross dependence. Alternative codec implementations can perform the adaptation at different intervals, such as after each transform block.

In the example encoder and decoder, the adaptation process 900 updates the value k. If the number of non-zero normalized coefficient is too large, then k is bumped up so that this number will tend to drop in future blocks. If the number of non-zero normalized coefficients is too small, then k is reduced with the expectation that future blocks will then produce more non-zero normalized coefficients because the bin size N is smaller. The example adaptation process constrains the value k to be within the set of numbers {0, 1, ... 16}, but alternative implementations could use other ranges of values for k. At each adaptation update, the encoder and decoder either increments, decrements, or leaves k unchanged. The example encoder and decoder increments or decrements k by one, but alternative implementations could use other step sizes.

The adaptation process 900 in the example encoder and decoder further uses an internal model parameter or state variable (M) to control updating of the grouping parameter k with a hysteresis effect. This model parameter provides a lag before updating the grouping parameter k, so as to avoid causing rapid fluctuation in the grouping parameter. The model parameter in the example adaptation process has 17 integer steps, from −8 to 8.

With reference now to FIG. 9, the example adaptation process 900 proceeds as follows. This example adaptation process is further detailed in the pseudo-code listing of FIGS. 10 and 11. At indicated at actions 910, 990, the adaptation process in the example encoder and decoder is performed separately on each transform band being represented in the compressed bitstream, including the luminance band and chrominance bands, AC and DC coefficients, etc. Alternative codecs can have vary in the number of transform bands, and further can apply adaptation separately or jointly to the transform bands.

At action 920, the adaptation process then counts the number of non-zero normalized coefficients of the transform band within the immediate previously encoded/decoded macroblock. At action 930, this raw count is normalized to reflect the integerized number of non-zero coefficients in a regular size area The adaptation process then calculates (action 940) the deviation of the count from the desired model (i.e., the "sweet-spot" of one quarter of the coefficients being non-zero). For example, a macroblock of AC coefficients in the example encoder shown in FIG. 4 has 240 coefficients. So, the desired model is for 70 out of the 240 coefficients to be non-zero. The deviation is further scaled, thresholded, and used to update the internal model parameter.

At next actions 960, 965, 970, 975, the adaptation process then adapts the value k according to any change in the internal model parameter. If the model parameter is less than a negative threshold, the value k is decremented (within its permissible bounds). This adaptation should produce more non-zero coefficients. On the other hand, if the model parameter exceeds a positive threshold, the value k is incremented (within permissible bounds). Such adaptation should produce fewer non-zero coefficients. The value k is otherwise left unchanged.

Again, as indicated at actions 910, 980, the adaptation process is repeated separately for each channel and sub-band of the data, such as separately for the chrominance and luminance channels.

The example adaptation process 900 is further detailed in the pseudo-code listing 1000 shown in FIGS. 10 and 11.

3. Efficient Entropy Encoding 3.1 Prior Art Methods

In various encoding standards, the process of coding of transform blocks reduces to the coding of a string of coefficients. One example of such a string is given in FIG. 12 as transform coefficients example 1200. In the example 1200, coefficients C0, C1, C2, C3, and C4 represent four non-zero coefficient values (of either positive or negative sign) while the other coefficients in the series have value zero.

Certain properties traditionally hold for such a string of transform coefficients:

The total number of coefficients is typically deterministic, and is given by the transform size.

Probabilistically, a large number of coefficients are zero.

At least one coefficient is non-zero. In the case that all coefficients are zero, the case is typically signaled through a coded block pattern, such as that described in Srinivasan, U.S. application No. TBD, "Non-Zero Coefficient Block Pattern Coding," filed Aug. 12, 2005.

Probabilistically, non-zero and larger valued coefficients occur at the beginning of the string, and zeros and smaller valued coefficients occur towards the end.

Non-zero coefficients take on integer values with known minimum/maximum.

Various encoding techniques take advantage of the fact that the zero-value coefficients, which typically occur rather frequently, can be coded with run length codes. However, when the input image being encoded is high dynamic range data (e.g. greater than 8 bits), or when the quantization parameter is unity or small, fewer transform coefficients are zero, as discussed above. In such a situation the adaptive coding and decoding techniques described above may be used to condition the data such that the conditioned data has these characteristics. Other techniques can also produce transform coefficient sets similar to those of transform coefficients example 1200 though other means, such as, for example, by setting a high quantization level.

Figure 12:
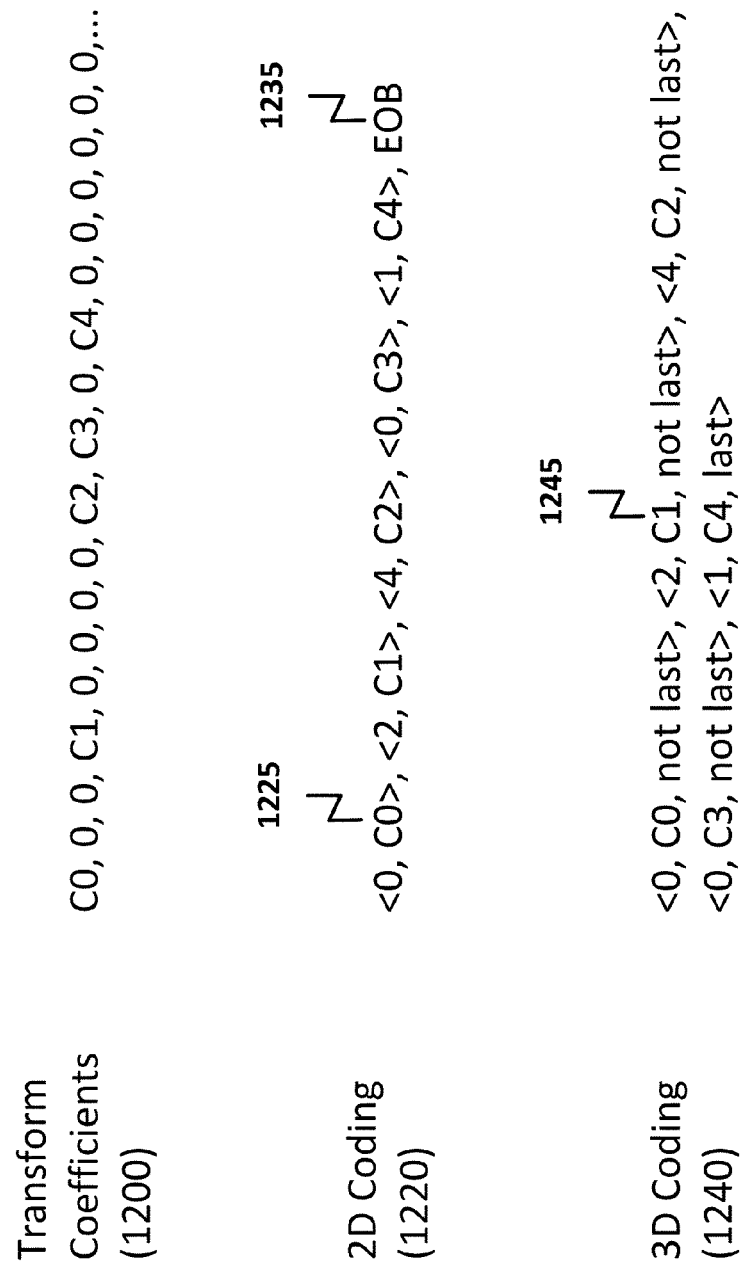
FIG. 12 illustrates examples of encoded transform coefficients in the prior art.

FIG. 12 also illustrates two methods of encoding transform coefficients such as those of the transform coefficients example 1200. These methods take advantage of jointly-coding a run of zeros together with the succeeding non-zero coefficient to provide a coding benefit. 2D coding example 1220 demonstrates one technique for such a run-level encoding scheme. As example 1220 illustrates, in 2D coding a run of zero-value coefficients (the run being either length zero or a positive length) is coded together as a symbol 1225 with the succeeding non-zero coefficient in the series of transform coefficients; in the illustrated case the symbol <0, C0> indicates that no zeroes precede the non-zero coefficient C0. A special symbol 1235 called "end of block," or EOB, is used to signal the last run of zeros. This is typically called 2D coding because each symbol jointly-codes run (the run of zero-value coefficients) and level (the non-zero coefficient value), and hence has two values, and can be thought of as encoding two dimensions of transform coefficient data. These symbols can then be entropy encoded using Huffman codes or arithmetic coding and are sent to the compressed bitstream 420 of FIG. 4.

Another alternative encoding scheme is 3D coding, an example of which is illustrated in example 1240. In 3D coding, the run of zeros is typically coded jointly with the succeeding non-zero coefficient, as in 2D coding. Further, a Boolean data element, "last," indicating whether this non-zero coefficient is the last non-zero coefficient in the block is encoded. The symbol 1245 therefore jointly-encodes run, level and last; in the illustrated case the symbol <2, C1, not last> indicates that two zeroes precede the non-zero coefficient C1, and that it is not the last non-zero coefficient in the series. Since each of these elements can freely take on all values, the symbol encodes three independent dimensions, giving rise to the name "3D coding."

Each of these techniques has separate advantages. Each symbol in the 2D coding technique has smaller entropy than the symbol used in 3D coding, because the former conveys less information than the latter. Thus, the number of possible symbols in a given 3D coding scheme will be twice as large as for a comparable 2D coding scheme. This increases code table size, and can slow down encoding and decoding for the 3D coding scheme. However, in 2D coding an additional symbol is sent to signal the end of block, and requiring the sending of an entire additional symbol is expensive from the perspective of the size of the bitstream. In fact, in practice, 3D coding is more efficient than 2D coding, despite the larger code table sizes.

3.2 3½D-2½D Coding

While the prior art techniques illustrated in FIG. 12 utilize joint-coding of non-zero coefficient levels along with preceding runs of zeroes, it can be demonstrated that the run of zeros succeeding a non-zero coefficient shows strong correlation with the magnitude of the non-zero coefficient. This property suggests the utility of jointly-encoding level and succeeding run.

FIG. 13 demonstrates one such alternative encoding technique which improves on the 2D and 3D techniques outlined in FIG. 12. FIG. 13 illustrates an example 1340 of a coding scheme utilizing the idea of coding succeeding runs of zeros to create symbols for an example series of transform coefficients 1300. FIG. 13 illustrates that the coefficients are jointly-coded into symbols 1355, which contain the value of a non-zero coefficient along with the length of the run of zeros which follow the non-zero coefficient (if any exist) as a pair: <level, run>. Thus the illustrated symbol 1355, <C1, 4>, jointly-codes the non-zero coefficient C1 and the four zero-value coefficients which follow it.

Besides taking advantage of the strong correlation between non-zero coefficients and runs of succeeding zeros, this method provides a further advantage when a non-zero coefficient is the last non-zero coefficient in the block, by utilizing a special value of run to signal that the non-zero coefficient is the last one in the series. Thus, in the joint-coding of a symbol, the information being sent is a level value and another value indicating either the length of a run of zeros, or a "last" value. This is illustrated in FIG. 13 by the symbol 1365, <C4, last>, which comprises a level value and a "last" value rather than the length of a run. Because these different situations are encoded in the same place in a symbol, run and "last" are not independent; only one is sent per symbol. Thus, the dimensionality of the symbol is neither 2 nor 3, rather it is somewhere in between. We refer to this encoding as being "2½D coding."

This feature of 2½D coding is not necessarily required of a joint-coding scheme which combines levels and succeeding runs; in an alternative implementation, the final symbol transmitted could simply encode the length of the final run of zeros, although this would be undesirable because it could substantially increase the size of the coded bitstream. In another alternative, an EOB symbol, like that used in 2D coding, could be used. However, as in 3D coding, the 2½D coding use of a "last" value carries an advantage over 2D coding in that there is no need to code an extra symbol to denote end of block. Additionally, 2½D coding carries advantages over 3D coding in that (1) the entropy of each symbol of the former is less than that of the latter and (2) the code table design of the former is simpler than that of the latter. Both these advantages are a result of the 2½D code having fewer possibilities than the 3D code.

However, 2½D coding alone cannot describe an entire run of transform coefficients because it does not provide for a way to send a run length prior to the first non-zero coefficient. As FIG. 13 illustrates, for this purpose, a special symbol 1375 is used, which additionally encodes the length of the first run of zeroes. This makes the first symbol a joint-coding of first_run, level and (run OR last). In FIG. 13, the first symbol 1375, <0, C0, 2>, sends the first run (which is zero), the level of the first non-zero coefficient, and the second run (which is 2, and the first non-zero coefficient is not the last non-zero coefficient in the block). Because this symbol comprises an additional dimension, the encoding for it is referred to as "3½D coding."

Although the extra information in 3½D coding might seem, at first glance, to negate some of the advantages of 2½D coding, the different handling of the first symbol is actually advantageous from the coding efficiency perspective. A 3½D symbol necessarily has a different alphabet from the other, 2½D, symbols, which means it is encoded separately from the other symbols and does not increase the 2½D entropy.

Figure 14:
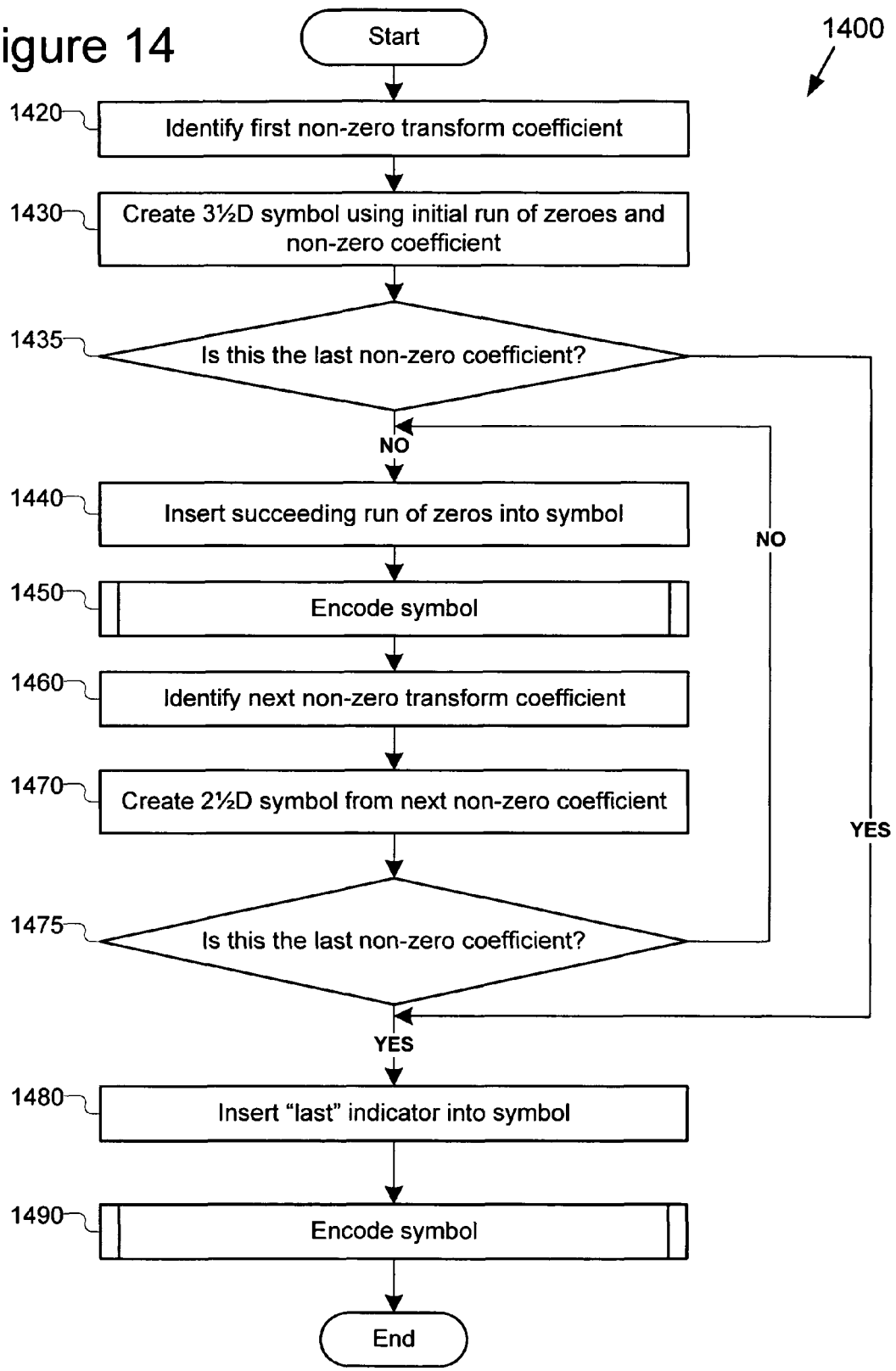
FIG. 14 is a flow chart showing a process by the encoder of FIG. 4 to encode transform coefficients.

FIG. 14 shows an example process 1400 by the encoder 400 (FIG. 4) to encode transform coefficients according to 2½D-3½D coding. In one environment, the process 1400 can be included as part of the process 720 of FIG. 7 for encoding normalized coefficients. In another, the process 1400 can be used to encode transform coefficients that have been quantized through traditional techniques. In various implementations of the process 1400, actions may be removed, combined, or broken up into sub-actions.

The process begins at action 1420, where the first non-zero transform coefficient is identified. Then, at action 1430, a 3½D symbol is created using the length of the initial run of zeroes (which could either be of length 0 or of positive length)

and the first non-zero coefficient. At this point, the 3½D symbol is not complete. Next, the process reaches decision action 1435, where it determines if the non-zero coefficient which is currently identified is the last non-zero coefficient in the series of transform coefficients. If this is the last non-zero coefficient, the process continues to action 1480, where the "last" indicator is inserted into the symbol rather than a run of succeeding zeroes. The process then encodes the symbol using entropy encoding at action 1490, and the process ends. One example of such a process of encoding symbols is given below with reference to FIG. 16.

If, however, the process determines at decision action 1435 that this is not the last non-zero coefficient, then at action 1440 the length of the succeeding run of zeros (which could either be 0 or a positive number) is inserted into the symbol, and the symbol is encoded at action 1450. One example of such a process of encoding symbols is given below with reference to FIG. 16. The process then identifies the next non-zero coefficient at action 1460, which is known to exist because the preceding non-zero coefficient was determined not to be the last one. At action 1470 a 2½D symbol is then created using this non-zero coefficient. At this point, like the 3½D symbol above, the symbol is not yet complete. Then, at decision action 1475, the process determines if the current non-zero coefficient is the last one in the series. If so, the process continues to action 1480, where the "last" indicator is included and the symbol encoded. If not, the process loops back to action 1440 where the next run of zeroes is included, the symbol encoded, and the process continues with the next non-zero coefficient.

3.3 Context Information

In addition to encoding symbols according to 2½D and 3½D coding, several pieces of causal information may be used to generate a context for the symbol being encoded. This context may be used by the encoder 400 (FIG. 4) or the decoder 500 (FIG. 5) to index into one of a collection of entropy coding tables to code and decode the symbol. Increasing the number of contexts gives more flexibility to the codec to adapt, or to use tables tailored to each specific context. However, the downside of defining a large number of contexts are that (1) there is context dilution (wherein each context applies only to a small number of symbols, thereby reducing the efficiency of adaptation), and (2) more code tables means more complexity and memory requirements.

With these points in mind the context model described herein is chosen to consult three factors to determine which context is chosen for each symbol. In one implementation these factors are (1) the level of transformation—whether the transform is an inner, intermediate, or outer transformation, (2) whether the coefficients are of the luminance or chrominance channels, and (3) whether there has been any break in the run of non-zero coefficients within the series of coefficients. In alternative implementations one or more of these factors may not be used for determining coding context, and/or other factors may be considered.

Thus, by (1), an inner transform uses a different set of code tables than an intermediate transform, which uses a different set of code tables than an outer transform. In other implementations, context models may only differentiate between two levels of transformation. Similarly, by (2) luminance coefficients use a different set of code tables than chrominance coefficients. Both of these context factors do not change within a given set of transform coefficients.

Figure 15:
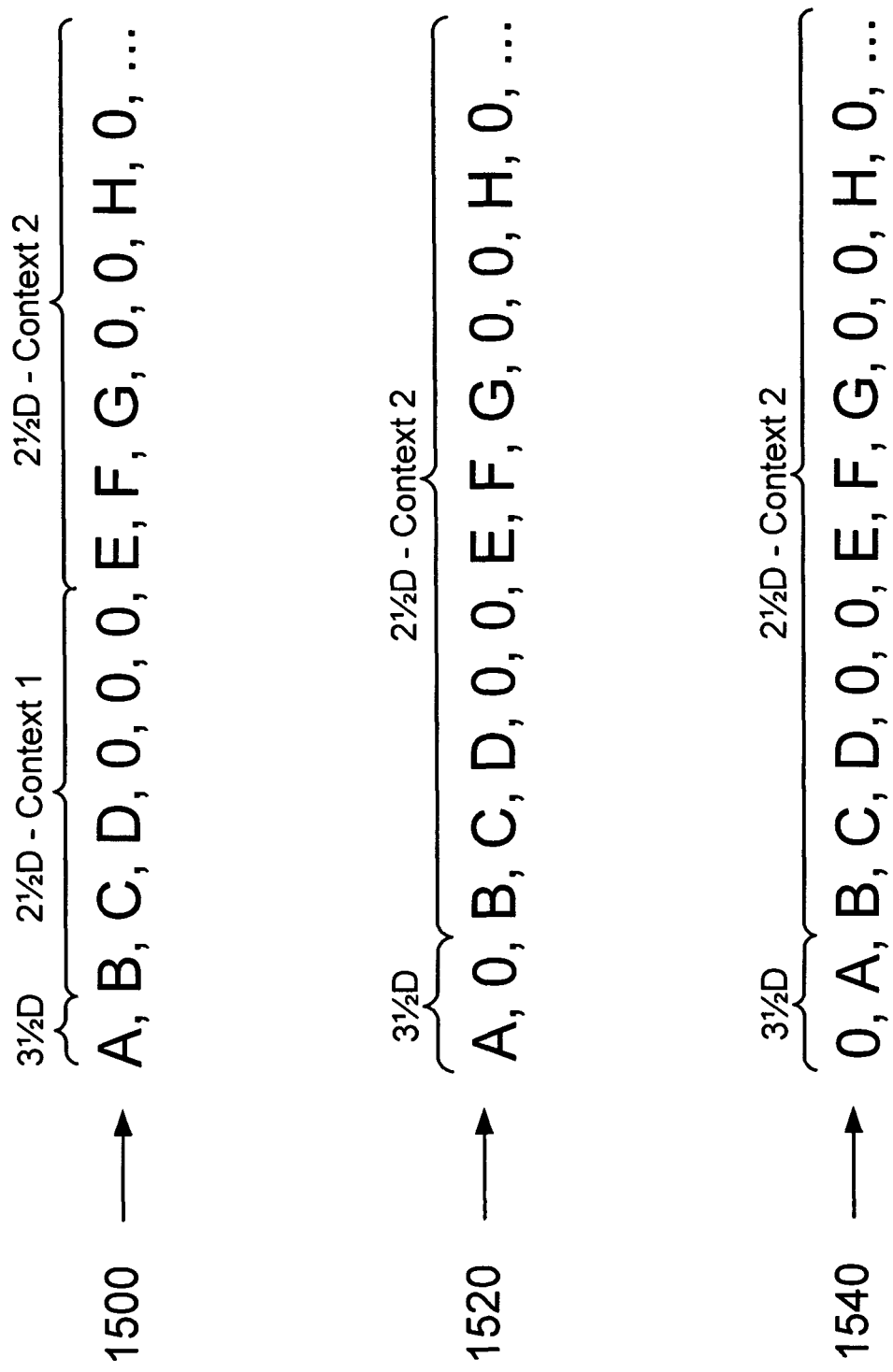
FIG. 15 illustrates examples of different code table contexts used to encode transform coefficients according to the techniques described herein.

However, factor (3) does change within a set of transform coefficients. FIG. 15 illustrates three example series of transform coefficients which better illustrate this context switching. In all three series 1500, 1520, and 1540, non-zero coefficients are represented by letters.

As all three example illustrate, the first symbol in a block, being a 3½D symbol, is necessarily coded with a different table than the other symbols because its alphabet is different from the others. This forms a "natural" context for the first symbol. Thus, coefficient A, being the first non-zero coefficient of all three examples is coded with a 3½D code. Additionally, because the 3½D symbol encodes preceding and succeeding runs of zeroes around the first non-zero coefficient, the first two coefficients of example 1520 (A, 0) and the first two coefficients of example 1540 (0, A) are jointly-coded in a 3½D symbol. Because of this, in one implementation, factor (3) does not apply to determine the context of 3½D symbols.

The 2½D symbols, by contrast, are encoded differently depending on factor (3). Thus, in example 1500, it can be seen that because there is no break in the run of non-zero coefficients until after coefficient D, coefficients B, C, and D (as well as the zeroes following D) are encoded with the first context model. However, the zeroes after D constitute a break in the run of non-zero coefficients. Therefore, the remaining coefficients E, F, G, H, (and any which follow) . . . are coded using the second context model. This means that while each non-zero coefficient other than A is encoded with a 2½D symbol, different code tables will be used for coefficients B, C, and D (and any associated zero-value runs) than are used for coefficients E, F, G, and H.

By contrast, in example 1520, there is a break between A and B. This constitutes a break in the run of non-zero coefficients, and hence coefficient B, and all subsequent non-zero coefficients are encoded with the second context model. Likewise, in example 1540, there is a break before A. Thus, as in example 1520, the coefficients B, C, D, . . . are coded with the second context model.

Figure 16:
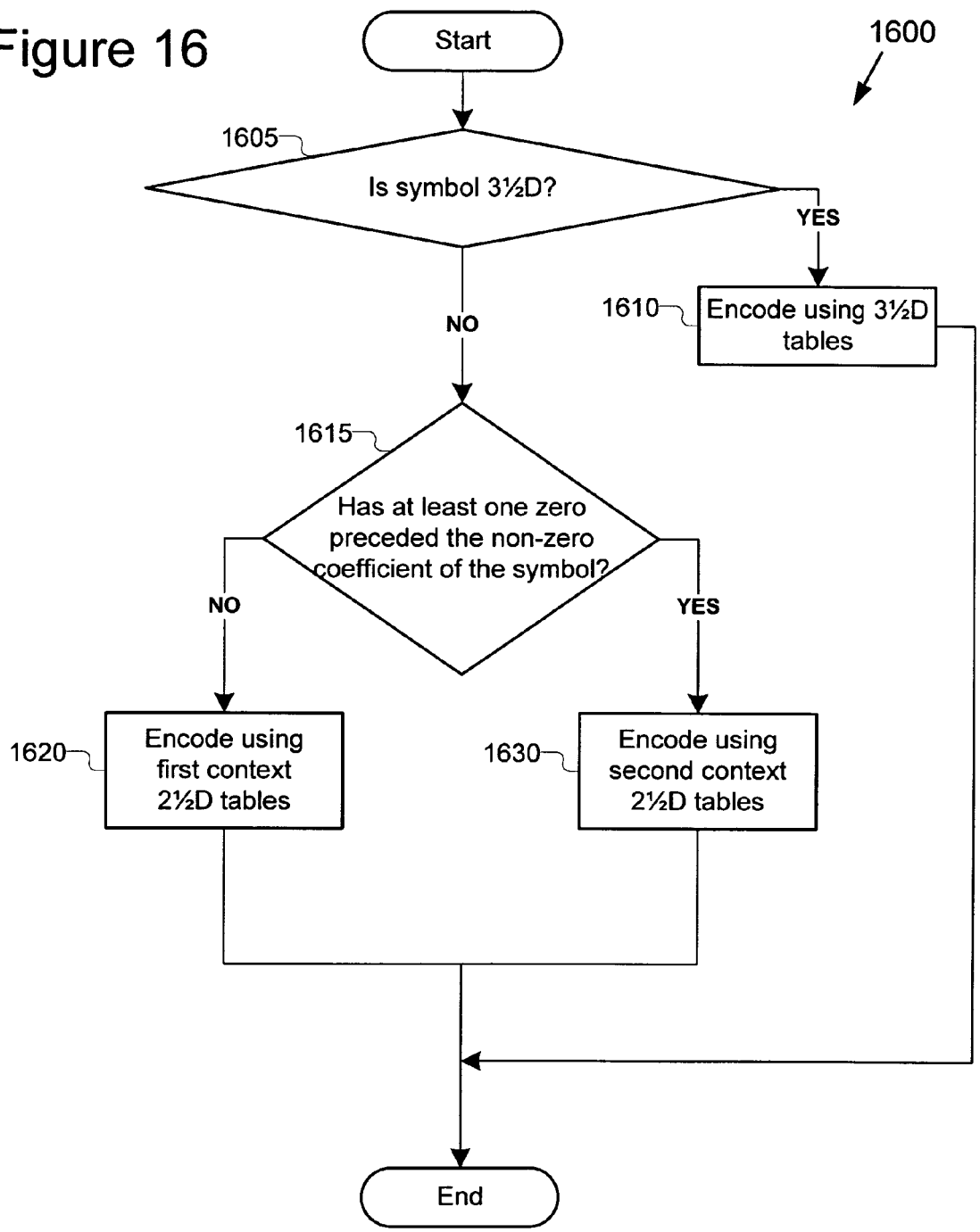
FIG. 16 is a flow chart showing a process by the encoder of FIG. 4 to determine coding contexts to be used when encoding transform coefficients.

FIG. 16 shows an example process 1600 by the encoder 400 (FIG. 4) to encode a symbol. In one implementation, the process 1600 performs the process of actions 1450 and 1490 of process 1400 (FIG. 14). In various implementations of the process 1600, actions may be removed, combined, or broken up into sub-actions. The process begins at decision action 1605, where the encoder determines if the symbol is a 3½D symbol. If so, the process continues to action 1610, where the symbol is encoded using 3½D tables and the process ends. In various implementations, the symbol may be encoded using entropy encoding, such as Huffman coding or arithmetic coding. Alternatively, other coding schemes may be used.

If the symbol is not a 3½D symbol, the process continues to decision action 1615, where the encoder determines whether at least one zero has preceded the non-zero coefficient which is jointly-coded in the symbol. If not, the process continues to action 1620, where the symbol is encoded using 2½D code tables from the first context model and the process ends. If there has been a break, then at action 1630 the symbol is encoded using 2½D code tables from the second context model and the process ends.

3.4 Code Table Size Reduction

While the techniques described above create efficiencies over traditional techniques, they are still not able, on their own, to reduce code table size significantly. Code tables created for the techniques should be able to transmit all combinations of (max_level×(max_run+2)) for the 2½D symbols, and (max_level×(max_run+1)×(max_run+2)) for the 3½D symbols, where max_level is the maximum (absolute) value of a non-zero coefficient and max_run is the maximum possible length of a run of zeroes. The value (max_run+1) is derived for the initial run of a 3½D symbol because the possible values for a run of zeroes run from 0 to max_run, for a total of (max_run+1). Similarly, each symbol encodes a succeeding run of zeros of length between 0 and max_run, as well as a "last" symbol, for a total of (max_run+2) values. Even with escape coding (where rarely occurring symbols are grouped together into one or multiple meta-symbols signaled through escape codes), code table sizes can be formidable.

In order to reduce code table size the techniques described above can be further refined. First, each run and each level is broken into a symbol pair:

run=nonZero_run(+run1)

level=nonOne_level(+level1)

In this symbol pair, the symbols nonZero_run and nonOne_level are Booleans, indicating respectively whether the run is greater than zero, and the absolute level is greater than 1. The values run1 and level1 are used only when the Booleans are true, and indicate the run (between 1 and the max_run) and level (between 2 and the max_level). However, because the case of "last" must also be coded, the value (run OR last) of any succeeding run of zeroes in a jointly-coded symbol is sent as a ternary symbol nonZero_run_last, which takes on the value 0 when the run has zero-length, 1 when the run has non-zero length, and 2 when the non-zero coefficient of the symbol is the last in the series.

Therefore, to utilize this reduced encoding the first, 3½D symbol takes on form <nonZero_run, nonOne_level, nonZero_run_last>. This creates an alphabet of size 2×2×3=12. Subsequent 2½D symbols take the form <nonOne_level, nonZero_run_last>, creating an alphabet of size 2×3=6. In one implementation, these symbols are referred to as the "Index." In some implementations, run1 is also called NonzeroRun and level1 is called SignificantLevel.

Because the Index only contains information about whether levels and runs are significant, additional information may need to be sent along with the symbols in order to allow a decoder to accurately recreate a series of transform coefficients. Thus, after each symbol from the index, if the level is a significant level, the value of the level is separately encoded and sent after the symbol. Likewise, if a symbol indicates that a run of zeroes is of non-zero (positive) length, that length is separately encoded and sent after the symbol.

Figure 17:
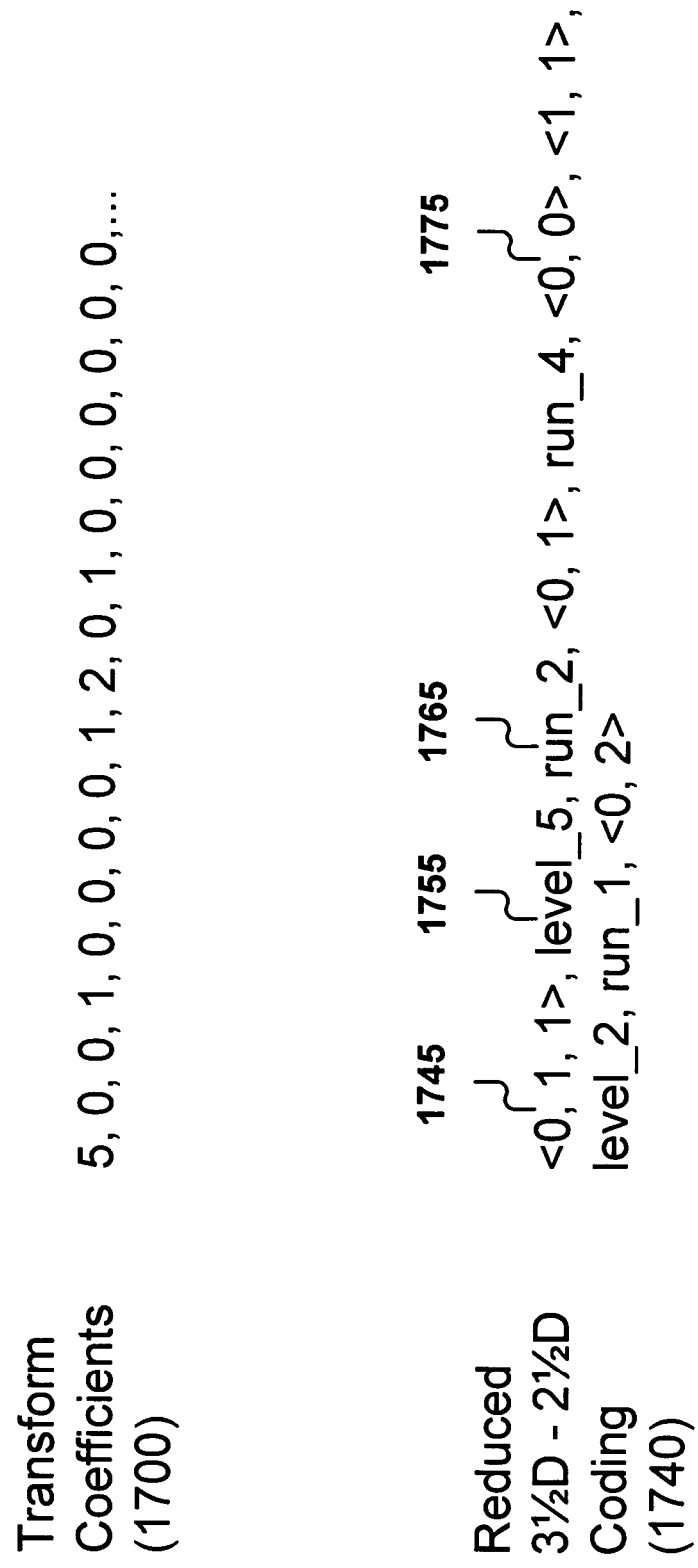
FIG. 17 illustrates an example of reduced transform coefficients encoded according to techniques described herein.

FIG. 17 illustrates an example of a reduced 3½D-2½D coding 1740 which represents an example series 1700 of absolute values of transform coefficients. The signs of transform coefficients may be encoded elsewhere. As FIG. 17 illustrates, the example series of coefficients 1700 begins with "5, 0, 0." In a non-reduced 3½D-2½D, such as those illustrated above, the first symbol would then be <0, 5, 2>. However, in the reduced coding, FIG. 17 illustrates a first symbol 1745 from the Index: <0, 1, 1>. This symbol indicates that there are no zeroes before the first non-zero coefficient, that the first non-zero coefficient has absolute value greater than 1, and that there is at least one zero after this non-zero coefficient. This symbol is then followed by a SignificantLevel value "level_5" (1755), indicating that the absolute value of the non-zero coefficient is 5, and a NonzeroRun value "run_2" (1765), which indicates that two zeroes follow the coefficient. By contrast, the symbol 1775, <0,0>, which indicates a non-zero coefficient of absolute value 1 followed by no zeroes, requires no other values following it to provide information.

Figure 18:
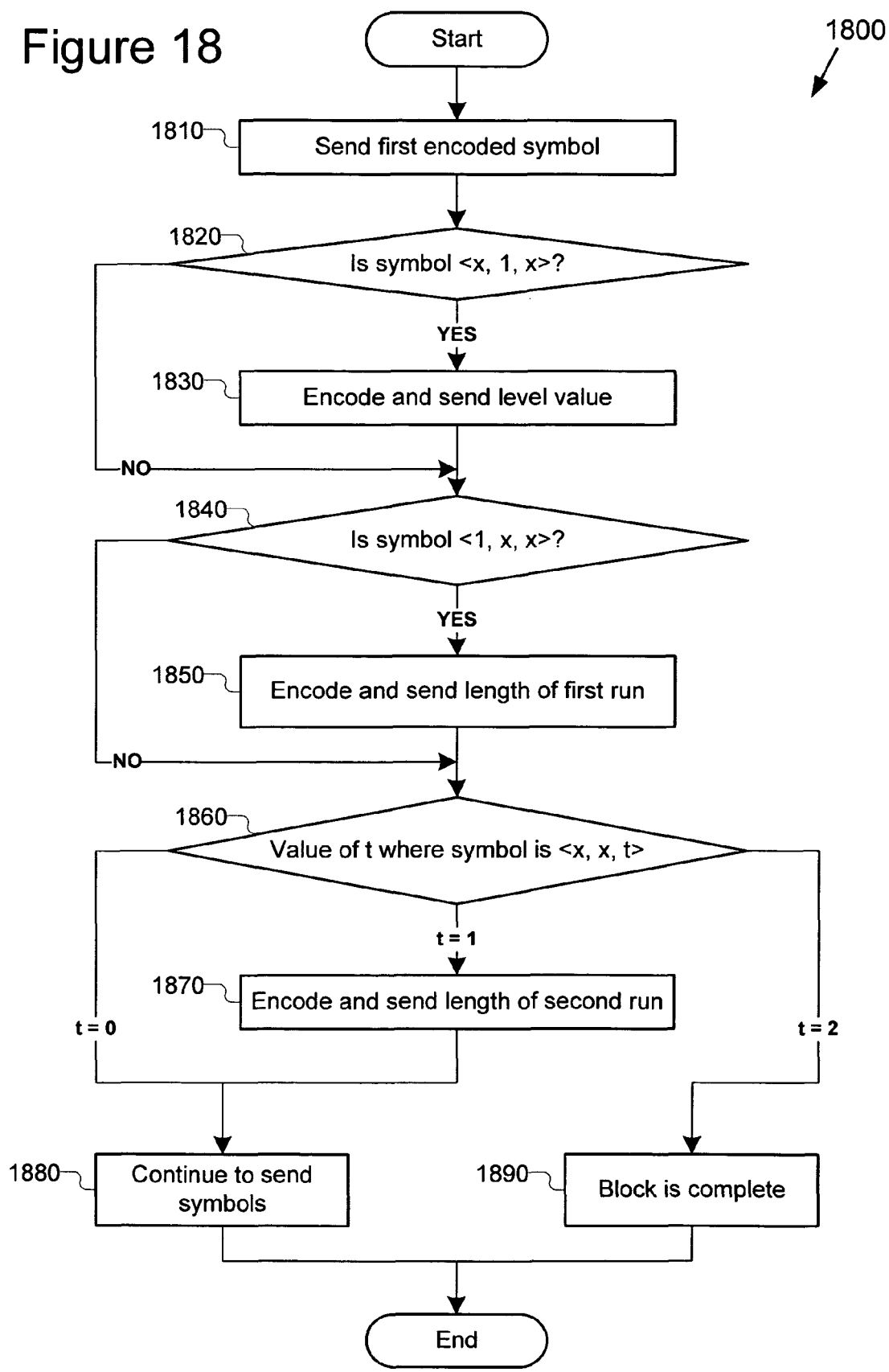
FIG. 18 is a flow chart showing a process by the encoder of FIG. 4 to encode and send initial transform coefficients in reduced form

Because some symbols require additional information be sent after them, symbols from the Index should be analyzed to determine if additional information should be sent along with them. FIG. 18 shows an example process 1800 by the encoder 400 (FIG. 4) to determine what information is contained in a 3½D Index symbol and to send additional information, if appropriate. In various implementations of the process 1800, actions may be removed, combined, or broken up into sub-actions. In the descriptions of symbols for FIG. 18, the value "x" is a placeholder, representing any possible value for that particular part of a symbol. The process starts at action 1810, where the first encoded symbol is sent. Next, at decision action 1820, the encoder determines whether the symbol is of form <x, 1, x>. This is equivalent to asking whether the non-zero coefficient represented by the symbol has absolute value greater than 1. If the encoder determines this to be the case, the value of the non-zero coefficient is encoded and sent at action 1830. It is important to note that while FIG. 18 does not explicitly discuss the coding of the sign of a non-zero coefficient, this sign could be included at several points in process 1800. In various implementations, this could involve sending the sign immediately following the joint-coded symbol, inside the joint-coded symbol, and/or along with the absolute value of the level.

The regardless of the determination at action 1820, at decision action 1840, the encoder determines if the symbol is of form <1, x, x>. This determination is equivalent to asking whether the non-zero coefficient represented by the symbol has any preceding zeroes. If so, at action 1850, the encoder encodes the length of the run of zeroes preceding the non-zero coefficient and sends this value.

Next, at decision action 1860, the encoder considers the value of t where the symbol is <x, x, t>. This determination is equivalent to asking whether the non-zero coefficient represented by the symbol has any zeroes following it. If t=0, then the encoder knows there are no succeeding zeroes, and continues to send more symbols at action 1880 and process 1800 ends. In one implementation, the process 1900 of FIG. 19 then begins for the next symbol. If t=1, the encoder then encodes and sends the length of the run of zeroes following the non-zero coefficient at action 1870, and then continues to send symbols at action 1880 and process 1800 ends. If t=2, however, the encoder knows the non-zero coefficient represented by the symbol is the last (and only) one in the series, and thus the block represented by the transform coefficients is complete. Thus, process 1800 ends and the next block can be transformed and encoded, if applicable.

Figure 19:
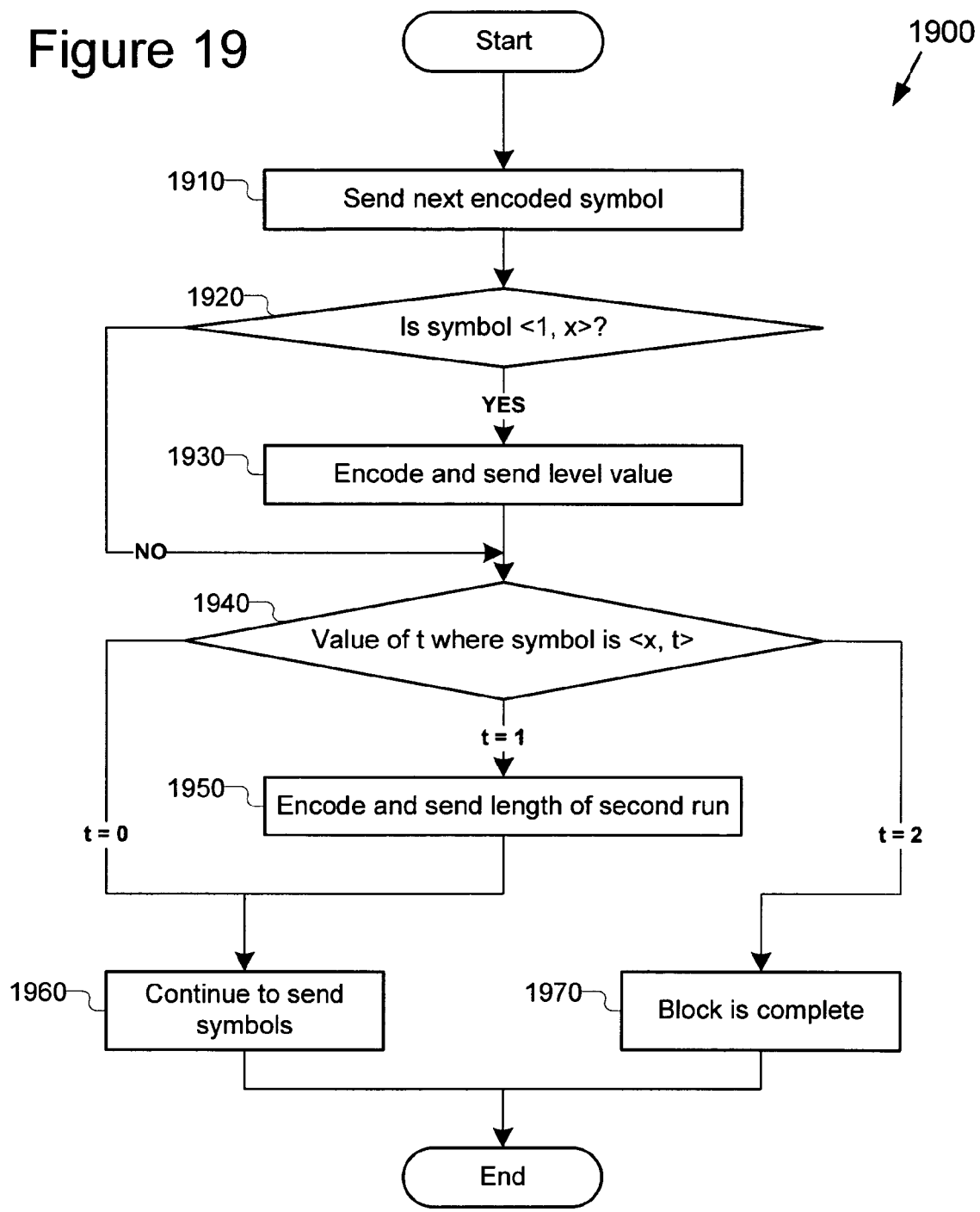
FIG. 19 is a flow chart showing a process by the encoder of FIG. 4 to encode and send subsequent coefficients in reduced form.

FIG. 19 shows an example process 1900 by the encoder 400 (FIG. 4) to determine what information is contained in a ½D Index symbol and to send additional information, if appropriate. In various implementations of the process 1900, actions may be removed, combined, or broken up into sub-actions. As in FIG. 18, in FIG. 19, the value "x" is a placeholder, representing any possible value for that particular part of a symbol. The process starts at action 1910, where the next encoded symbol is sent. Next, at decision action 1920, the encoder determines whether the symbol is of form <1, x>. This is equivalent to asking whether the non-zero coefficient represented by the symbol has absolute value greater than 1. If the encoder determines this to be the case, the value of the non-zero coefficient is encoded and sent at action 1930. As in process 1800, it is important to note that while FIG. 19 does not explicitly discuss the coding of the sign of a non-zero coefficient, this sign could be included at several points in process 1900.

Next, at decision action 1940, the encoder considers the value of t where the symbol is <x, t>. This determination is equivalent to asking whether the non-zero coefficient represented by the symbol has any zeroes following it. If t=0, then the encoder knows there are no succeeding zeroes, and continues to send more symbols at action 1960 and process 1900 ends. In one implementation, the process 1900 of FIG. 19 then repeats for the next symbol. If t=1, the encoder then encodes and sends the length of the run of zeroes following the non-zero coefficient at action 1950, and then continues to send symbols at action 1960 and process 1900 ends. If t=2, however, the encoder knows the non-zero coefficient represented by the symbol is the last one in the series, and thus the block represented by the transform coefficients is complete. Thus, process 1900 ends and the next block can be transformed and encoded, if applicable.

3.5 Additional Efficiencies

Besides the code table size reduction discussed above, one benefit of breaking down run and level symbols is that subsequent to the transmission of the 3½D joint symbol, the decoder can determine whether or not there are any leading zeros in the block. This means that context information describing whether the first or second context model holds is known on the decoder side and constitutes a valid context for encoding the level1 value of the first non-zero coefficient. This means that the contexts which apply to the level1 values of the 2½D symbols can apply equally to level1 values of 3½D symbols, even while the jointly-coded Index symbols utilize different alphabets.

Moreover, since the total number of transform coefficients in a block is a constant, each successive run is bounded by a monotonically decreasing sequence. In a preferred implementation, this information is exploited in the encoding of run values. For example, a code table may include a set of run value codes for runs starting in the first half of a set of coefficients and a different set for runs starting in the second half. Because length of any possible run starting in the second half is necessarily smaller than the possible lengths of runs starting in the first half, the second set of codes does not have to be as large, reducing the entropy and improving coding performance.

Other information can be gleaned by careful observation of coefficient placement. For example, if the non-zero coefficient represented by a symbol occurs at the last location in the series of coefficients, then "last" is true always. Similarly, if the non-zero coefficient represented by a symbol occurs at the penultimate location in the array, then either "last" is true, or the succeeding run is zero. Each of these observations allows for coding via shorter tables.

3.6 Index Implementation Example

The first Index has an alphabet size of 12. In one implementation, five Huffman tables are available for this symbol, which is defined as FirstIndex=a+2b+4 c, where the symbol is <a,b,c> and a and b are 0 or 1, and c can take on values 0, 1 or 2. One implementation of code word lengths for the twelve symbols for each of the tables is given below. Standard Huffman code construction procedures may, in one implementation, be applied to derive these sets of prefix codewords:

Table 1: 5,6,7,7,5,3,5,1,5,4,5,3
Table 2: 4,5,6,6,4,3,5,2,3,3,5,3
Table 3: 2,3,7,7,5,3,7,3,3,3,7,4
Table 4: 3,2,7,5,5,3,7,3,5,3,6,3
Table 5: 3,1,7,4,7,3,8,4,7,4,8,5

Subsequent Index symbols have an alphabet size of 6. In one implementation, Index is defined as Index=a+2b, where the symbol is <a,b> and a is Boolean and b can take on values of 0, 1 or 2. Four Huffman tables are defined for Index, as shown below:

Table 1: 1,5,3,5,2,4
Table 2: 2,4,2,4,2,3
Table 3: 4,4,2,2,2,3
Table 4: 5,5,2,1,4,3

Additionally, in one implementation, in order to take advantage of some of the information described in Section 3.5 above, when the coefficient is located at the last array position, a one bit code (defined by a) is used (b is uniquely 2 in this case). In one implementation, when the coefficient is in the penultimate position, a two bit code is used since it is known that b≠1.

One implementation of SignificantLevel codes the level using a binning procedure that collapses a range of levels into seven bins. Levels within a bin are coded using fixed length codes, and the bins themselves are coded using Huffman codes. This can be done, in one implementation, through the grouping techniques described above. Similarly, in one implementation, NonzeroRun is coded using a binning procedure that indexes into five bins based on the location of the current symbol.

3.7 Decoding 3½D-2½D Symbols

Figure 20:
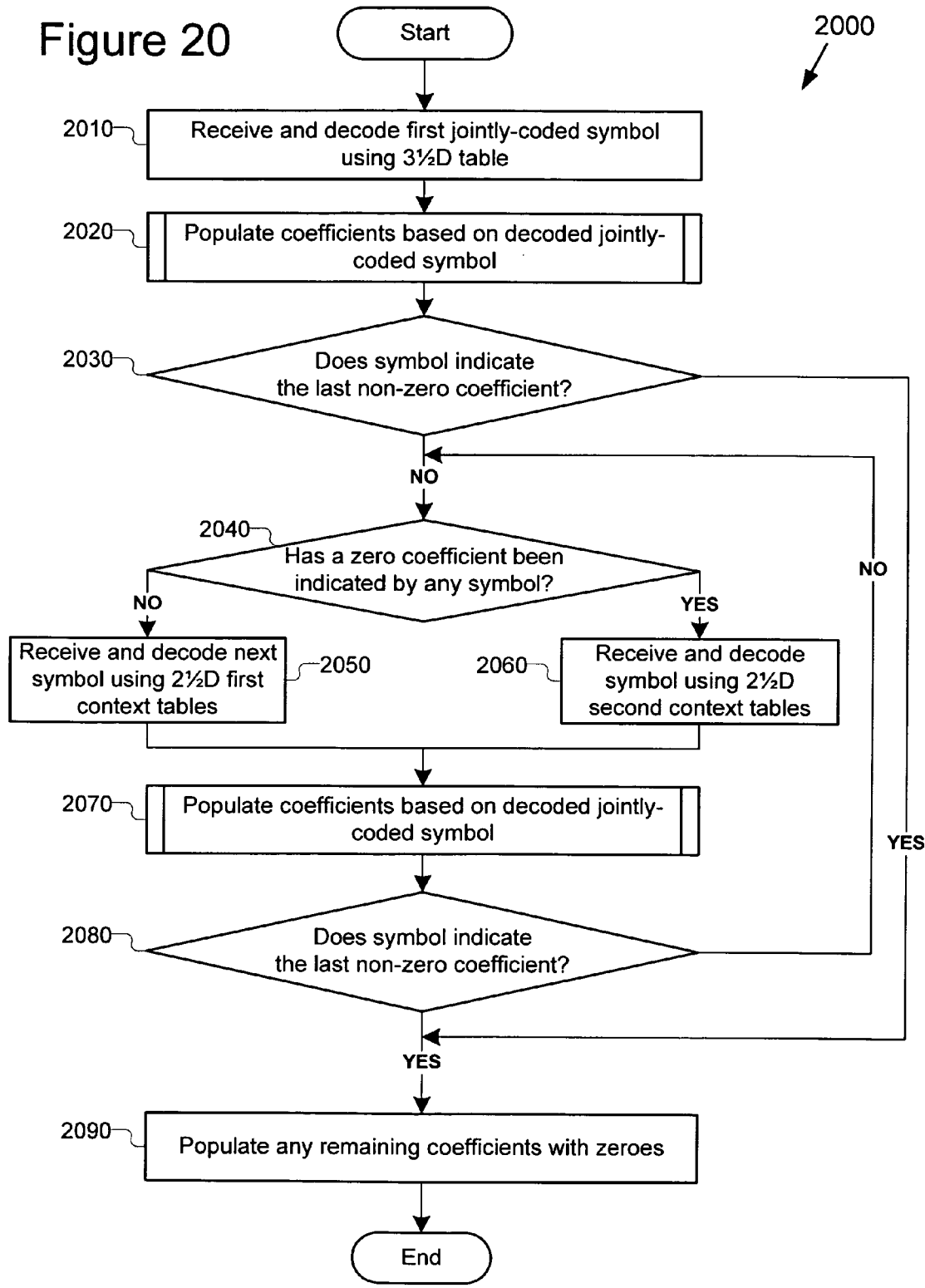
FIG. 20 is a flow chart showing a process by the decoder of FIG. 5 to decode encoded transform coefficients.

FIG. 20 shows an example process 2000 by the decoder 500 (FIG. 5) to decode a series of symbols into transform coefficients. In various implementations of the process 2000, actions may be removed, combined, or broken up into sub-actions. Further, actions may be defined to handle error conditions such as those triggered by corrupted bitstreams. The process begins at action 2010, where the decoder receives the first jointly-coded symbol and decodes it using the 3½D code table. Next, at action 2020, transform coefficients are populated based on the decoded symbol (including any level or run information also present in the compressed bitstream). One implementation of this action is described in greater detail below with respect to FIG. 21. The process then continues to decision action 2030, where the decoder determines if the symbol indicates that it is for the last non-zero coefficient. If so, the process continues to action 2090, where any remaining un-populated coefficients are populated with zeroes and process 2000 ends.

If the symbol is not for the last non-zero coefficient, the process continues to decision action 2040, where the decoder determines if any zero coefficients have been indicated by any symbol thus far. If not, the process continues to action 2050, where the next symbol is received and decoded using 2½D code tables following the first context model. If instead zero coefficients have been indicated at decision action 2040, then at process 2060, the decoder receives and decodes the next symbol using 2½D code tables following the second context model. Regardless of which context model was used, the process then proceeds to action 2070, where transform coefficients are populated based on the decoded symbol (including any level or run information also present in the compressed bitstream). As in action 2020, one implementation of this action is described in greater detail below with respect to FIG. 21. The process then continues to decision action 2080, where the decoder determines if the symbol indicates that it is for the last non-zero coefficient. If not, the process returns to decision action 2040 and repeats. If so, the process continues to action 2090, where any remaining un-populated coefficients are populated with zeroes, and process 2000 ends.

Figure 21:
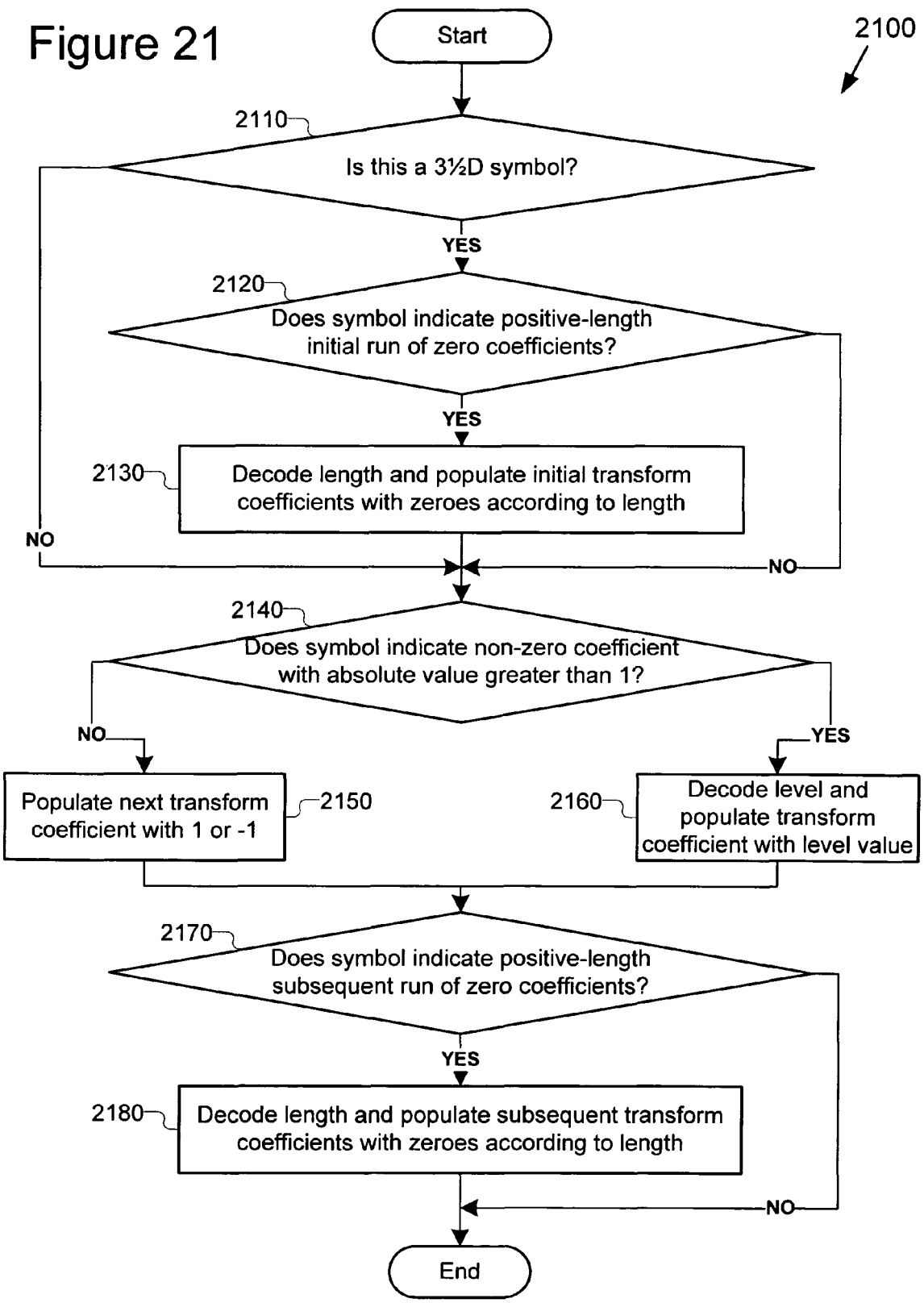
FIG. 21 is a flow chart showing a process by the decoder of FIG. 5 to populate transform coefficients from decoded symbols.

FIG. 21 shows an example process 2100 by the decoder 500 (FIG. 5) to populate transform coefficients. In various implementations of the process 2100, actions may be removed, combined, or broken up into sub-actions. While process 2100 is configured to decode symbols encoded according to the techniques of Section 3.4 above, in alternative implementations, level values and run lengths may be included in 2½D and 3½D symbols, which would allow process 2100 to be simplified. The process begins at decision action 2110, where the decoder determines if the symbol is a 3½D symbol. If not, the process jumps to decision action

2140, which is described below. If, however the symbol is a 3½D symbol, the decoder determines at decision action 2120 if the symbol indicates a positive-length initial run of zero coefficients. This can be done by determining if the value of nonzero_run in the 3½D symbol is 1, indicating a positive-length run, or 0, indicating a zero-length run. If the symbol does indicate a positive-length run of zero coefficients, the process continues to action 2130, where the length of the run is decoded, based on the encoded level1 following the 3½D symbol, and initial transform coefficients are populated with zeroes according to the run length.

Next, the process continues to decision action 2140, where the decoder determines if the symbol indicates that its non-zero coefficient has absolute value greater than 1. This can be done by determining if the value of nonOne_level in the symbol is 1, indicating the level has absolute value greater than 1, or 0, indicating that the non-zero coefficient is either −1 or 1. If the symbol does not indicate a coefficient with absolute value greater than 1, the process continues to action 2150, where the next coefficient is populated with either a −1 or a 1, depending on the sign of the non-zero coefficient. If the symbol does indicate a coefficient with absolute value greater than 1, the process instead continues to action 2160, where the level of the coefficient is decoded and the coefficient is populated with the level value, along with its sign. As discussed above, the sign may be indicated in various ways, thus decoding of the coefficient sign is not explicitly discussed in actions 2150 or 2160.

Next, at decision action 2170, the decoder determines if the symbol indicates a positive-length subsequent run of zero coefficients. This can be done by determining if the value of nonzero_run_last in the symbol is 1, indicating a positive-length run, or 0, indicating a zero-length run. (The case of nonzero_run_last equaling 2 is not shown, as that case is caught in process 2000.) If the symbol does indicate a positive-length run of zero coefficients, the process continues to action 2180, where the length of the run is decoded, based on the encoded run1 following the symbol, and subsequent transform coefficients are populated with zeroes according to the run length and process 2100 ends.

4. Computing Environment

The above described encoder 400 (FIG. 4) and decoder 500 (FIG. 5) and techniques for efficiently encoding and decoding transform coefficients can be performed on any of a variety of devices in which digital media signal processing is performed, including among other examples, computers; image and video recording, transmission and receiving equipment; portable video players; video conferencing; and etc. The digital media coding techniques can be implemented in hardware circuitry, as well as in digital media processing software executing within a computer or other computing environment, such as shown in FIG. 22.

Figure 22:
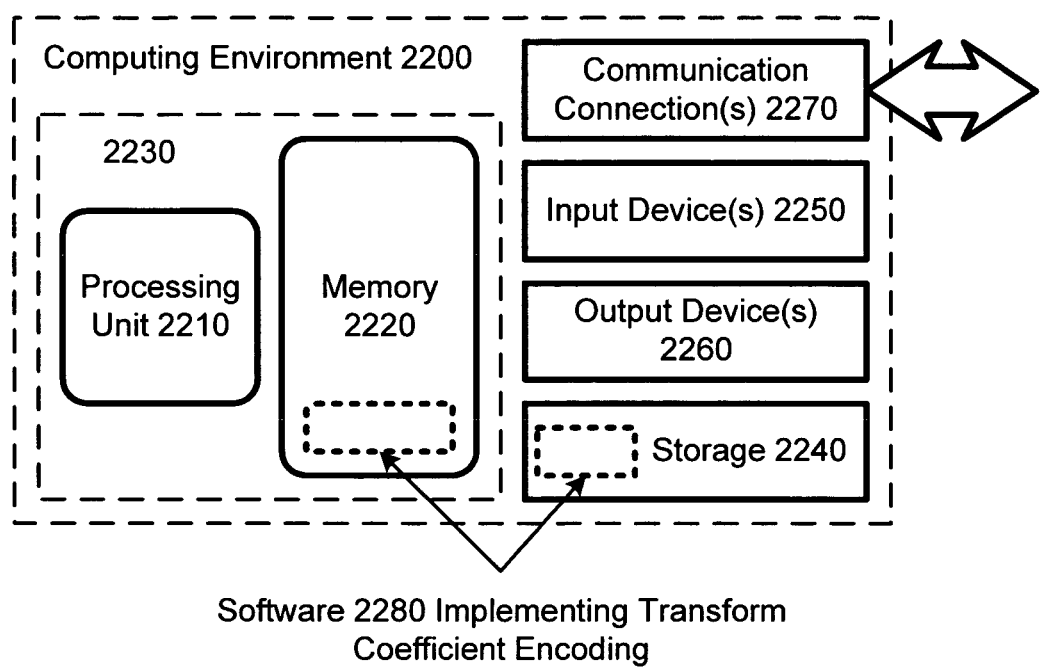
FIG. 22 is a block diagram of a suitable computing environment for implementing the adaptive coding of wide range coefficients of FIG. 6.

FIG. 22 illustrates a generalized example of a suitable computing environment (2200) in which described embodiments may be implemented. The computing environment (2200) is not intended to suggest any limitation as to scope of use or functionality of the invention, as the present invention may be implemented in diverse general-purpose or special-purpose computing environments.

With reference to FIG. 22, the computing environment (2200) includes at least one processing unit (2210) and memory (2220). In FIG. 22, this most basic configuration (2230) is included within a dashed line. The processing unit (2210) executes computer-executable instructions and may be a real or a virtual processor. In a multi-processing system, multiple processing units execute computer-executable instructions to increase processing power. The memory (2220) may be volatile memory (e.g., registers, cache, RAM), non-volatile memory (e.g., ROM, EEPROM, flash memory, etc.), or some combination of the two. The memory (2220) stores software (1280) implementing the described encoder/decoder and efficient transform coefficient encoding/decoding techniques.

A computing environment may have additional features. For example, the computing environment (2200) includes storage (2240), one or more input devices (2250), one or more output devices (2260), and one or more communication connections (2270). An interconnection mechanism (not shown) such as a bus, controller, or network interconnects the components of the computing environment (2200). Typically, operating system software (not shown) provides an operating environment for other software executing in the computing environment (2200), and coordinates activities of the components of the computing environment (2200).

The storage (2240) may be removable or non-removable, and includes magnetic disks, magnetic tapes or cassettes, CD-ROMs, CD-RWs, DVDs, or any other medium which can be used to store information and which can be accessed within the computing environment (2200). The storage (2240) stores instructions for the software (2280) implementing the described encoder/decoder and efficient transform coefficient encoding/decoding techniques.

The input device(s) (2250) may be a touch input device such as a keyboard, mouse, pen, or trackball, a voice input device, a scanning device, or another device that provides input to the computing environment (2200). For audio, the input device(s) (2250) may be a sound card or similar device that accepts audio input in analog or digital form, or a CD-ROM reader that provides audio samples to the computing environment. The output device(s) (2260) may be a display, printer, speaker, CD-writer, or another device that provides output from the computing environment (2200).

The communication connection(s) (2270) enable communication over a communication medium to another computing entity. The communication medium conveys information such as computer-executable instructions, compressed audio or video information, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

The digital media processing techniques herein can be described in the general context of computer-readable media. Computer-readable media are any available media that can be accessed within a computing environment. By way of example, and not limitation, with the computing environment (2200), computer-readable media include memory (2220), storage (2240), communication media, and combinations of any of the above.

The digital media processing techniques herein can be described in the general context of computer-executable instructions, such as those included in program modules, being executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing environment.

For the sake of presentation, the detailed description uses terms like "determine," "generate," "adjust," and "apply" to describe computer operations in a computing environment. These terms are high-level abstractions for operations performed by a computer, and should not be confused with acts performed by a human being. The actual computer operations corresponding to these terms vary depending on implementation.

In view of the many possible variations of the subject matter described herein, we claim as our invention all such embodiments as may come within the scope of the following claims and equivalents thereto.

I claim:

1. A method of encoding a series of transform coefficients for a block representing digital media data, comprising:
   using a computing device that implements an encoder, representing the series of transform coefficients as a series of symbols, wherein a given symbol of the series of symbols represents (a) an indication of a non-zero coefficient from the series of transform coefficients and (b) an indication of whether the non-zero coefficient is a last non-zero coefficient for the block and, if not the last non-zero coefficient for the block and in place of the indication of whether the non-zero coefficient is the last non-zero coefficient for the block, a length of a run of subsequent zero-value coefficients from the non-zero coefficient; and
   for each symbol in the series of symbols, sending the symbol to be encoded in a compressed bitstream.

2. The method of claim 1, wherein the given symbol is a first symbol in the series of symbols, and wherein the given symbol additionally represents (c) an indication of a length of a run of zero-value coefficients preceding a first non-zero coefficient in the series of transform coefficients.

3. The method of claim 2, wherein the series of transform coefficients results from determining a normalized part of a series of wide-range transform coefficients.

4. The method of claim 2, wherein one set of code tables is used to code the first symbol in the series of symbols, and a different set of code tables is used to code other symbols in the series of symbols.

5. The method of claim 1, wherein the given symbol in the series of symbols has an associated context.

6. The method of claim 5, wherein the context for a symbol is based at least in part on whether a non-zero coefficient represented by the symbol occurs before or after a first zero-value coefficient in the series of coefficients.

7. The method of claim 5, wherein the context for a symbol is based at least in part on whether the series of transform coefficients are for luminance or chrominance channels.

8. The method of claim 5, wherein the context for a symbol is based at least in part on whether the series of transform coefficients are for an inner transform, intermediate transform or an outer transform.

9. The method of claim 1, wherein the given symbol indicates:
   the run of subsequent zero-value coefficients is of length zero; or
   the run of subsequent zero-value coefficients is of a positive length.

10. The method of claim 9, wherein the given symbol is a first symbol in the series of symbols, and wherein the given symbol further represents (c) a boolean indicating whether or not a run of zero-value coefficients preceding the first non-zero coefficient is of length zero or is of a positive length.

11. The method of claim 9, further comprising, when the given symbol indicates the run of subsequent zero-value coefficients is of a positive length, sending the length of the run of subsequent zero-value coefficients to be encoded in the compressed bitstream.

12. The method of claim 1, wherein, for the given symbol, the indication of the non-zero coefficient from the series of transform coefficients comprises a boolean indicating whether or not the absolute value of the non-zero coefficient is greater than 1.

13. The method of claim 12, further comprising, when the non-zero coefficient has an absolute value greater than 1, sending the absolute value of the non-zero coefficient to be encoded in the compressed bitstream.

14. The method of claim 1, wherein the method is performed by hardware circuitry in the computing device.

15. The method of claim 1, wherein the digital media data is high dynamic range digital media data.

16. A digital media decoder comprising:
   a data storage buffer for storing encoded digital media data; and
   a processor configured to:
      receive a set of compressed symbols describing a series of transform coefficients;
      uncompress the symbols; and
      reconstruct the series of transform coefficients by analyzing the set of uncompressed symbols;
   wherein:
      the set of compressed symbols comprises jointly-coded symbols, each encoded from a set of code tables according to a context model;
      a given jointly-coded symbol of the jointly-coded symbols describes (a) a non-zero level from the series of transform coefficients and (b) a three-state value, wherein a first state indicates that the non-zero level is a last non-zero level in the series, a second state indicates that the number of subsequent zero value coefficients before the next non-zero level is zero, and a third state indicates that the number of subsequent zero value coefficients is greater than zero, and
      when the given jointly-coded symbol is a first symbol in the set of compressed symbols, the given jointly-coded symbol further describes (c) whether there are zero-value coefficients preceding the non-zero level in the series of transform coefficients.

17. The digital media decoder of claim 16, wherein:
   the given jointly-coded symbol describes a non-zero level by indicating whether an absolute value of the non-zero level is greater than 1;
   the set of compressed symbols additionally comprises level symbols describing the value of each non-zero level whose absolute value is greater than 1 and indications of level signs; and
   the processor is further configured to, when analyzing a jointly-coded symbol which indicates a non-zero level whose absolute value is greater than 1, reconstruct the non-zero level using by finding the level symbol which describes the value of the non-zero level.

18. The digital media decoder of claim 16, wherein the set of compressed symbols additionally comprises run symbols describing the length of each run of zero-value coefficients whose length is greater than 0.

19. The method of claim 16, wherein the encoded digital media data is encoded high dynamic range digital media data.

20. One or more computer-readable storage devices storing computer-executable instructions which when executed by a computer cause the computer to perform a method of decoding compressed digital media data, the method comprising:

receiving a bitstream comprising compressed jointly-coded symbols, each encoded from a set of code tables according to a context model, the bitstream including an initial jointly-coded symbol from the jointly-coded symbols;

decoding the jointly-coded symbols, the decoding including decoding the initial jointly-coded symbol to determine first data providing an indication of a run of initial transform coefficient zeros, second data providing an indication of a non-zero transform coefficient level, and third data indicating one of three values, a first of the three values signaling that the non-zero transform coefficient level is a last non-zero transform coefficient level, a second of the three values signaling that a run of subsequent transform coefficient zeros is zero, and a third of the three values signaling that a run of subsequent transform coefficient zeros is greater than zero; and reconstructing a set of transform coefficients from decoded levels and runs of transform coefficient zeros.

21. The computer-readable storage devices of claim 20, wherein the initial jointly-coded symbol is for a block in an image or video frame and is the only symbol for the block that is decoded to determine the run of initial transform coefficient zeros.

22. The computer-readable storage devices of claim 20, wherein:
the second data indicates, for the non-zero transform coefficient level, whether that level has an absolute value greater than 1;
the first data indicates, for the run of initial transform coefficient zeros, if that run has length greater than 0;
when the non-zero coefficient level is not the last non-zero transform coefficient level, the third data indicates, for the run of subsequent transform coefficients zeros, if that run has length greater than 0;
the bitstream further comprises compressed symbols describing the non-zero lengths of runs of transform coefficient zeros, and a sign and magnitude of non-zero transform coefficient levels; and
decoding the jointly-coded symbols comprises:
when decoding a jointly-coded symbol which indicates that a transform coefficient level has absolute value greater than 1, determining a transform coefficient level by decoding one or more symbols in the bitstream which indicate the sign and value of the transform coefficient level; and
when decoding a jointly-coded symbol which indicates that a run of transform coefficient zeros is greater than 0, determining the length of the run of transform coefficient zeros by decoding a symbol in the bitstream which indicates the length of the run.

23. The method of claim 20, wherein the compressed digital media data is compressed high dynamic range digital media data.

24. A method of decoding compressed digital media data, the method comprising:

receiving a bitstream comprising compressed jointly-coded symbols, each encoded from a set of code tables according to a context model, the bitstream including an initial jointly-coded symbol from the jointly coded symbols;

decoding the jointly-coded symbols, the decoding including decoding the initial jointly-coded symbol to determine first data providing an indication of a run of initial transform coefficient zeros, second data providing an indication of a non-zero transform coefficient level, and third data providing an indication of whether the non-zero transform coefficient level is a last non-zero transform coefficient level and, if not and in place of the indication of whether the non-zero transform coefficient level is the last non-zero transform coefficient level, providing a length of a run of subsequent transform coefficient zeros; and reconstructing a set of transform coefficients from decoded levels and runs of transform coefficient zeros.

25. The method of claim 24, wherein the initial jointly-coded symbol is for a block in an image or video frame and is the only symbol for the block that is decoded to determine the run of initial transform coefficient zeros.

26. The method of claim 24,
wherein the second data indicates, for the non-zero transform coefficient level, whether that level has an absolute value greater than 1;
wherein the first data indicates, for the run of initial transform coefficient zeros, if that run has length greater than 0;
wherein, when the non-zero coefficient level is not the last non-zero transform coefficient level, the third data indicates, for the run of subsequent transform coefficients zeros, if that run has length greater than 0;
wherein the bitstream further comprises compressed symbols describing the non-zero lengths of runs of transform coefficient zeros, and a sign and magnitude of non-zero transform coefficient levels; and
wherein decoding the jointly-coded symbols comprises:
when decoding a jointly-coded symbol which indicates that a transform coefficient level has absolute value greater than 1, determining a transform coefficient level by decoding one or more symbols in the bitstream which indicate the sign and value of the transform coefficient level; and
when decoding a jointly-coded symbol which indicates that a run of transform coefficient zeros is greater than 0, determining the length of the run of transform coefficient zeros by decoding a symbol in the bitstream which indicates the length of the run.

27. The method of claim 24, wherein the method is performed by hardware circuitry.

28. The method of claim 24, wherein the compressed digital media data is compressed high dynamic range digital media data.

* * * * *